(12) United States Patent
Nakatani et al.

(10) Patent No.: US 7,079,829 B2
(45) Date of Patent: Jul. 18, 2006

(54) SEMICONDUCTOR DIFFERENTIAL CIRCUIT, OSCILLATION APPARATUS, SWITCHING APPARATUS, AMPLIFYING APPARATUS, MIXER APPARATUS AND CIRCUIT APPARATUS USING SAME, AND SEMICONDUCTOR DIFFERENTIAL CIRCUIT PLACEMENT METHOD

(75) Inventors: Toshifumi Nakatani, Osaka (JP); Hisashi Adachi, Osaka (JP); Yukio Hiraoka, Hyogo (JP)

(73) Assignee: Matsushita Electric Industrial Co, Ltd., Osaka (JP)

( * ) Notice: Subject to any disclaimer, the term of this patent is extended or adjusted under 35 U.S.C. 154(b) by 454 days.

(21) Appl. No.: 10/712,971

(22) Filed: Nov. 13, 2003

(65) Prior Publication Data

US 2004/0140511 A1 Jul. 22, 2004

(30) Foreign Application Priority Data

Nov. 15, 2002 (JP) .............................. 2002-332688

(51) Int. Cl.
*H04B 1/28* (2006.01)
*H01L 27/01* (2006.01)

(52) U.S. Cl. ...................... 455/333; 257/347; 257/501; 438/151; 438/586

(58) Field of Classification Search ................ 465/131, 465/232.1, 255, 313, 323, 333, 334; 257/347, 257/401, 499, 500, 501, 508, 517, 519, 520, 257/901; 438/151, 163, 585, 586

See application file for complete search history.

(56) References Cited

U.S. PATENT DOCUMENTS

| 4,695,479 A | * | 9/1987 | Nakakura et al. ........... 438/585 |
| 5,021,843 A | * | 6/1991 | Ohmi ......................... 257/379 |
| 5,485,029 A | | 1/1996 | Crabbé |
| 5,681,761 A | | 10/1997 | Kim |

(Continued)

FOREIGN PATENT DOCUMENTS

| JP | 8-17847 | 1/1996 |
| JP | 8-316420 | 11/1996 |
| JP | 11-501466 | 2/1999 |

OTHER PUBLICATIONS

M. Tiebout, "Low-Power Low-Phase-Noise Differentially Tuned Quadrature VCO Design in Standard CMOS", IEEE Journal of Solid-State Circuits, vol. 36, No. 7, pp. 1018-1024, Jul. 2001.

*Primary Examiner*—Quochien B. Vuong
(74) *Attorney, Agent, or Firm*—RatnerPrestia

(57) ABSTRACT

A semiconductor differential circuit comprising a semiconductor substrate, a first semiconductor device on the semiconductor substrate having a gate electrode for having one of differential signals conveyed thereto and a drain electrode for outputting one of the differential signals controlled by the gate electrode, a second semiconductor device formed on the semiconductor substrate having a gate electrode for having the other of the differential signals conveyed thereto and a drain electrode for outputting the other of the differential signals controlled by the gate electrode, and wherein the drain electrode and drain electrode are placed in the proximity so that, at a predetermined frequency, it is equivalent to the one in which the drain electrode is grounded via a predetermined resistance, and the drain electrode is grounded via the predetermined resistance.

25 Claims, 18 Drawing Sheets

U.S. PATENT DOCUMENTS

| | | | |
|---|---|---|---|
| 6,037,632 A | * | 3/2000 | Omura et al. ................ 257/341 |
| 6,037,634 A | * | 3/2000 | Akiyama .................... 257/347 |
| 6,211,549 B1 | * | 4/2001 | Funaki et al. ............... 257/329 |
| 6,316,296 B1 | * | 11/2001 | Sakamoto ................... 438/151 |
| 6,650,001 B1 | * | 11/2003 | Yamaguchi et al. ........ 257/557 |
| 6,674,126 B1 | * | 1/2004 | Iwamoto et al. ............ 257/341 |

* cited by examiner

US 7,079,829 B2

SEMICONDUCTOR DIFFERENTIAL CIRCUIT, OSCILLATION APPARATUS, SWITCHING APPARATUS, AMPLIFYING APPARATUS, MIXER APPARATUS AND CIRCUIT APPARATUS USING SAME, AND SEMICONDUCTOR DIFFERENTIAL CIRCUIT PLACEMENT METHOD

BACKGROUND OF THE INVENTION

1. Field of the Invention

The present invention relates to a semiconductor differential circuit used for a high-frequency circuit of, for example, a portable telephone, an oscillation apparatus, an amplifying apparatus and a switching apparatus using the semiconductor differential circuit, and a semiconductor differential circuit placement method.

2. Related Art of the Invention

With the rapid dissemination of portable telephones, it has become increasingly necessary to miniaturize the radio portion thereof. For that reason, it is a trend in recent years to render the radio portion as an IC. To embody the radio portion as an IC, it is necessary to embody as ICs an oscillator and a low noise amplifier which were manufactured with discrete parts and modules in the past.

FIG. 12 shows an example of a circuit embodied as an IC of an oscillation apparatus in the past. In the circuit shown in FIG. 12, a coil 1002 and a coil 1003 are connected in series, and a power supply 1001 is connected to a connection point of the coil 1002 and coil 1003. A series circuit of the coil 1002 and coil 1003 has a circuit to which switching elements 1006 and 1007 are connected in series via DC blocking capacitors 1004 and 1005 and a circuit to which variable capacity elements 1008 and 1009 are connected in series via DC blocking capacitors 1025 and 1026 connected in parallel thereto. A negative resistance circuit formed by MOSFETs 1010 and 1020 is connected to a resonant circuit formed as above so that the circuit as a whole is formed as a differential oscillator. The switching elements 1006 and 1007 are connected with a control voltage terminal 13 so that a frequency band of a calling frequency can be switched by a control voltage applied to the control voltage terminal 13.

FIG. 13 shows an example of a circuit embodied as an IC of an amplifying apparatus in the past. In the circuit shown in FIG. 13, a coil 1027 and a coil 1028 are connected in series, and a power supply 1029 is connected to the connection point of the coil 1027 and coil 1028. The series circuit of the coil 1027 and coil 1028 has MOSFETs 1030 and 1031 connected thereto so as to form a differential amplifier.

In the case where the oscillator shown in FIG. 12 is formed on a silicon substrate (not shown), however, a parasitic capacitance 1023 and a parasitic resistance 1024 are formed between it and the substrate on a drain 1021 side. Therefore, as shown in FIG. 14, the coil 1003 is equivalent to a parallel connection circuit to the series circuit of the parasitic capacitance 1023 and parasitic resistance 1024 as to a high-frequency signal component. Thus, if influenced by the parasitic capacitance 1023 and parasitic resistance 1024, a characteristic of the resonant circuit becomes a blunt one as shown by the broken line which was originally the one shown in full line as shown in FIG. 15. To be more specific, Q of the resonant circuit deteriorates and C/N deteriorates.

In the case where an amplifier circuit shown in FIG. 13 is formed on the silicon substrate, the parasitic capacitance 1023 and parasitic resistance 1024 are similarly formed between it and the substrate on the drains 1021 and 1022 side of the MOSFETs. Therefore, a high-frequency signal leaks to the parasitic resistance 1024 via the parasitic capacitance 1023. And a part of the high-frequency signal is lost due to influence of the parasitic resistance. Consequently, a noise characteristic deteriorates due to influence of a parasitic component of a gate, and a distortion characteristic deteriorates due to influence of the parasitic component of a drain.

In the case where a switching element is formed on the silicon substrate, the parasitic resistance and parasitic capacitance are formed as described above, consequently leading to a loss on turning on the switching element. When used in combination with the above oscillator for instance, in an ON state of the switching element, the resonant circuit is further influenced by the parasitic resistance and parasitic capacitance via the switching element. Thus, the Q-value further becomes blunt and the characteristic deteriorates.

To solve the above problems, some solutions have been provided. For instance, one solution proposes a constitution in which an oxide film is formed between a semiconductor device and the silicon substrate (refer to Japanese Translation of PCT International Application No. 11-501466 for instance). Thus, it is possible, by forming the oxide film between the semiconductor device and the silicon substrate, to reduce the parasitic capacitance 1023 so as to improve the characteristic deterioration of the oscillator and the low noise amplifier. In reality, however, a manufacturing process had to be changed to implement such a constitution, resulting in a high-cost process.

Another solution proposes a constitution in which impurity concentration of the silicon substrate is reduced to increase a resistance value of the parasitic resistance 1024 (refer to Japanese Patent Laid-Open No. 8-316420 for instance). The disclosures of Japanese Translation of PCT International Application No. 11-501466 and Japanese Patent Laid-Open No. 8-316420 are incorporated herein by reference in their entireties. FIG. 16 schematically shows the Q-value of the resonant circuit constituting the oscillator shown in FIG. 12 on changing the parasitic resistance 1024. Such a characteristic can be derived from a conductance and susceptance of the resonant circuit as the coils 1002 and 1003 in the circuit shown in FIG. 12 replaced by the circuit shown in FIG. 14. As for the characteristic shown in FIG. 16, the Q-value especially deteriorates in the range in which the parasitic resistance 1024 is 100 to 500 ohms. Therefore, to improve the Q-value of the resonant circuit, the resistance value of the parasitic resistance 1024 should be increased or decreased from the above range. Thus, it is possible, by reducing the impurity concentration of the silicon substrate, to increase the resistance value of the parasitic resistance 1024 so as to improve the characteristic of the oscillating circuit. It is also possible, in the amplifier circuit, to curb the characteristic deterioration by increasing the parasitic resistance. However, this solution also required the manufacturing process to be changed, resulting in a high-cost process.

A further solution proposes a contact for grounding the silicon substrate placed as close as possible to the MOSFETs. FIG. 17 is a plan view showing a configuration of such multi-finger type MOSFETs. In the configuration shown in FIG. 17, a source electrode 1032 in a longitudinal shape is placed, a gate electrode 1033 in a longitudinal shape is placed to be adjacent to the source electrode 1032, and a drain electrode 1034 in a longitudinal shape is placed to be adjacent to the gate electrode 1033. And a contactor 1035 connected to a silicon substrate wiring 1036 is placed close to the drain electrode 1034. The silicon substrate wiring 1036 is connected to an earth electrode. It is possible, by such a configuration, to reduce the resistance value of the parasitic resistance 1024 from the drain electrode 1034 to the earth electrode so as to improve the characteristic of the Q-value in the oscillating circuit for the above-mentioned reason. It is also possible, in the amplifier circuit, to curb the characteristic deterioration by reducing the parasitic resistance 1024.

As for the solution shown in FIG. 17, however, it is necessary to place a large number of contactors 1035 in order to sufficiently reduce a parasitic resistance 1024 in each drain electrode 1034. For instance, if MOSFETs 1010 and 1020 of the oscillating circuit shown in FIG. 12 are implemented on a semiconductor substrate, the placement will be as shown in FIG. 18. Thus, the area for mounting the contactors 1035 and silicon substrate wiring 1036 further becomes necessary so that the entire IC chip becomes large enough to be a factor of increased cost.

An object of the present invention is to provide a semiconductor differential circuit capable of miniaturizing an IC chip, an oscillation apparatus using the semiconductor differential circuit, an amplifying apparatus using the semiconductor differential circuit and a switching apparatus using the semiconductor differential circuit, and a semiconductor differential circuit placement method.

SUMMARY OF THE INVENTION

The $1^{st}$ aspect of the present invention is a semiconductor differential circuit comprising: a semiconductor substrate, a first semiconductor device formed on said semiconductor substrate, having a first gate electrode for having one of differential signals conveyed thereto and a first drain electrode for outputting one of the differential signals controlled by said first gate electrode;

a second semiconductor device formed on said semiconductor substrate, having a second gate electrode for having the other of said differential signals conveyed thereto and a second drain electrode for outputting the other of the differential signals controlled by said second gate electrode, and wherein:

said first drain electrode and said second drain electrode are placed in the proximity so that, at a predetermined frequency, it is equivalent to the one in which said first drain electrode is grounded via a first predetermined resistance, and said second drain electrode is grounded via a resistance of the same resistance value as said first predetermined resistance.

The $2^{nd}$ aspect of the present invention is the semiconductor differential circuit according to the $1^{st}$ aspect of the present invention, wherein the resistance value of said first predetermined resistance is half the resistance value formed between said first drain electrode and said second drain electrode via said semiconductor substrate, which is determined by space between said first drain electrode and said second drain electrode at said predetermined frequency.

The $3^{rd}$ aspect of the present invention is the semiconductor differential circuit according to the $1^{st}$ aspect of the present invention, wherein said first semiconductor device and said second semiconductor device are multi-finger type FETs respectively, and are placed so that a longitudinal direction of said second drain electrode is along and in the proximity of the longitudinal direction of said first drain electrode.

The $4^{th}$ aspect of the present invention is the semiconductor differential circuit according to the $3^{rd}$ aspect of the present invention, wherein:

as to said first semiconductor device:

said first gate electrode is placed to be adjacent to said first drain electrode along the longitudinal direction of said first drain electrode; and it has a first source electrode placed to be adjacent to said first gate electrode along the longitudinal direction of said first gate electrode, and as to said second semiconductor device:

said second gate electrode is placed to be adjacent to said second drain electrode along the longitudinal direction of said second drain electrode; and it has a second source electrode placed to be adjacent to said second gate electrode along the longitudinal direction of said second gate electrode, and a circuit comprising said first semiconductor device and said second semiconductor device is provided as a first unit circuit;

n pieces of said first unit circuit are placed to be mutually adjacent;

an i+1-th first unit circuit is placed to be adjacent to an i-th (i is between 1 and n−1) first unit circuit; and said n pieces of first drain electrode are mutually connected, said n pieces of second drain electrode are mutually connected, said n pieces of first gate electrode are mutually connected, said n pieces of second gate electrode are mutually connected, and said n pieces of first source electrode and said n pieces of second source electrode are mutually connected.

The $5^{th}$ aspect of the present invention is the semiconductor differential circuit according to the $3^{rd}$ aspect of the present invention, wherein:

a third source electrode is formed on said semiconductor substrate;

said first gate electrode is placed to be adjacent to said third source electrode along the longitudinal direction of said third source electrode;

said first drain electrode is placed in the proximity of said first gate electrode on the opposite side to said third source electrode along the longitudinal direction of said first gate electrode;

said second drain electrode is placed to be adjacent to said first drain electrode on the opposite side to said first gate electrode along the longitudinal direction of said first drain electrode;

said second gate electrode is placed to be adjacent to said second drain electrode on the opposite side to said first drain electrode along the longitudinal direction of said second drain electrode, and a circuit comprising said third source electrode, said first gate electrode, said first drain electrode, said second drain electrode and said second gate electrode is provided as a second unit circuit;

n pieces of said second unit circuit are placed to be mutually adjacent;

said second gate electrode of the i-th (i is between 1 and n−1) second unit circuit is placed to be adjacent to said third source electrode of the i+1-th second unit circuit; and said n pieces of first drain electrode are mutually connected, said n pieces of second drain electrode are mutually connected, said n pieces of first gate electrode are mutually connected, said n pieces of second gate electrode are mutually connected, and said n pieces of third source electrode are mutually connected.

The $6^{th}$ aspect of the present invention is the semiconductor differential circuit according to the $1^{st}$ aspect of the present invention, wherein:

said first gate electrode is placed to surround said first drain electrode;

said second gate electrode is placed to surround said second drain electrode; and a source electrode is placed between said first gate electrode and said second gate electrode.

The 7$^{th}$ aspect of the present invention is the semiconductor differential circuit according to the 6$^{th}$ aspect of the present invention, wherein:

there are two pieces each of said first drain electrode and said second drain electrode;

a source electrode is placed between one first drain electrode and one second drain electrode;

an electrode connected to said source electrode is placed between the other first drain electrode and the other second drain electrode;

an electrode connected to said source electrode is placed between one first drain electrode and the other second drain electrode; and an electrode connected to said source electrode is placed between the other first drain electrode and said one second drain electrode.

The 8$^{th}$ aspect of the present invention is the semiconductor differential circuit according to the 1$^{st}$ or the 2$^{nd}$ aspects of the present invention, wherein:

said first gate electrode is placed to be adjacent to said first drain electrode;

said second gate electrode is placed to be adjacent to said second drain electrode; and a source electrode is placed to surround said first drain electrode, said second drain electrode, said first gate electrode and said second gate electrode and to be adjacent to said first gate electrode and said second gate electrode.

The 9$^{th}$ aspect of the present invention is the semiconductor differential circuit according to the 8$^{th}$ aspect of the present invention, wherein there are two pieces each of said first drain electrode and said second drain electrode, and one first drain electrode and one second drain electrode are placed to be in proximity, the other first drain electrode and the other second drain electrode are placed to be in proximity, said one first drain electrode and said other second drain electrode are placed to be in proximity, and said other first drain electrode and said one second drain electrode are placed to be in proximity.

The 10$^{th}$ aspect of the present invention is a semiconductor differential circuit comprising:

a semiconductor substrate, a first semiconductor device, formed on said semiconductor substrate, having a first collector or base for having one of differential signals conveyed thereto; and a second semiconductor device, formed on said semiconductor substrate, having a second collector or base for having the other of said differential signals conveyed thereto, and wherein:

said first collector or base and said second collector or base are placed in the proximity so that, at a predetermined frequency, it is equivalent to the one in which said first collector or base is grounded via a second predetermined resistance, and said second collector or base is grounded via a resistance of the same resistance value as said second predetermined resistance.

The 11$^{th}$ aspect of the present invention is an oscillation apparatus using the semiconductor differential circuit according to the 1$^{st}$ or the 10$^{th}$ aspects of the present invention.

The 12$^{th}$ aspect of the present invention is a switching apparatus using the semiconductor differential circuit according to the 1$^{st}$ or the 10$^{th}$ aspects of the present invention.

The 13$^{th}$ aspect of the present invention is an amplifying apparatus using the semiconductor differential circuit according to the 1$^{st}$ or the 10$^{th}$ aspects of the present invention.

The 14$^{th}$ aspect of the present invention is a semiconductor differential circuit placement method comprising the steps of:

forming on a semiconductor substrate a first semiconductor device having a first drain electrode for having one of differential signals conveyed thereto and a first gate electrode for controlling said one of the signals;

forming on said semiconductor substrate a second semiconductor device having a second drain electrode for having the other of said differential signals conveyed thereto and a second gate electrode for having said other signal conveyed thereto formed, and wherein:

said first drain electrode and said second drain electrode are placed in the proximity so that, at a predetermined frequency, it is equivalent to the one in which said first drain electrode is grounded via a first predetermined resistance, and said second drain electrode is grounded via a resistance of the same resistance value as said first predetermined resistance.

The 15$^{th}$ aspect of the present invention is the semiconductor differential circuit according to the 1$^{st}$ aspect of the present invention, wherein:

it further comprises:

a third semiconductor device, formed on said semiconductor substrate, having a second gate electrode for having the other of said differential signals conveyed thereto, and a first drain electrode for outputting one of the differential signals controlled by said second gate electrode; and a fourth semiconductor device, formed on said semiconductor substrate, having a first gate electrode for having one of said differential signals conveyed thereto, and a second drain electrode for outputting the other of the differential signals controlled by said first gate electrode, and the differential signals conveyed to said first gate electrode and said second gate electrode are differential local oscillation signals;

said first semiconductor device has a first source electrode for having one of the differential signals to be mixed with said differential local oscillation signals conveyed thereto;

said second semiconductor device shares said first source electrode with said first semiconductor device;

said third semiconductor device shares said first drain electrode with said first semiconductor device, and has a second source electrode for having the other of the differential signals to be mixed with said differential local oscillation signals conveyed thereto;

said fourth semiconductor device shares said second source electrode with said third semiconductor device, and shares said second drain electrode with said second semiconductor device;

said differential signals controlled by said second gate electrode are the differential signals having said differential local oscillation signals and said differential signals to be mixed mixed therein; and said first drain electrode and said second drain electrode are placed in the proximity so that, at a frequency of said mixed differential signals, it is equivalent to the one in which said first drain electrode is grounded via a first predetermined resistance, and said second drain electrode is grounded via a resistance of the same resistance value as said first predetermined resistance.

The 16th aspect of the present invention is the semiconductor differential circuit according to the 15th aspect of the present invention, wherein:

said first gate electrode and said second gate electrode are placed in the proximity so that, at a frequency of said differential local oscillation signals, it is equivalent to the one in which said first gate electrode is grounded via a third predetermined resistance, and said second gate electrode is grounded via a resistance of the same resistance value as said third predetermined resistance; and said first source electrode and said second source electrode are placed in the proximity so that, at a frequency of the differential signals to be mixed with said differential local oscillation signals, it is equivalent to the one in which said first source electrode is grounded via a fourth predetermined resistance, and said second source electrode is grounded via a resistance of the same resistance value as said fourth predetermined resistance.

The 17th aspect of the present invention is the semiconductor differential circuit according to the 15th aspect of the present invention, wherein the resistance value of said first predetermined resistance is half the resistance value formed between said first drain electrode and said second drain electrode via said semiconductor substrate, which is determined by space between said first drain electrode and said second drain electrode at the frequency of said mixed differential signals.

The 18th aspect of the present invention is the semiconductor differential circuit according to the 16th aspect of the present invention, wherein the resistance value of said third predetermined resistance is half the resistance value formed between said first gate electrode and said second gate electrode via said semiconductor substrate, which is determined by space between said first gate electrode and said second gate electrode at the frequency of said differential local oscillation signals.

The 19th aspect of the present invention is the semiconductor differential circuit according to the 16th aspect of the present invention, wherein the resistance value of said fourth predetermined resistance is half the resistance value formed between said first source electrode and said second source electrode via said semiconductor substrate, which is determined by space between said first source electrode and said second source electrode at the frequency of the differential signals to be mixed.

The 20th aspect of the present invention is the semiconductor differential circuit according to the 15th aspect of the present invention, wherein said first semiconductor device, said second semiconductor device, said third semiconductor device and said fourth semiconductor device are multi-finger type FETs respectively, and are placed so that a longitudinal direction of said second drain electrode is along and in the proximity of the longitudinal direction of said first drain electrode.

The 21st aspect of the present invention is the semiconductor differential circuit according to the 16th aspect of the present invention, wherein said first semiconductor device, said second semiconductor device, said third semiconductor device and said fourth semiconductor device are multi-finger type FETs respectively, and are placed so that a longitudinal direction of said second gate electrode is along and in the proximity of the longitudinal direction of said first gate electrode.

The 22nd aspect of the present invention is the semiconductor differential circuit according to the 16th aspect of the present invention, wherein said first semiconductor device, said second semiconductor device, said third semiconductor device and said fourth semiconductor device are multi-finger type FETs respectively, and are placed so that a longitudinal direction of said second source electrode is along and in the proximity of the longitudinal direction of said first source electrode.

The 23rd aspect of the present invention is the semiconductor differential circuit according to any one of the 20th to the 22nd aspects of the present invention, wherein:

the first source electrode is formed on said semiconductor substrate;

said first gate electrode is placed to be adjacent to said first source electrode along the longitudinal direction of said first source electrode; and said first drain electrode is placed to be adjacent to said first gate electrode on the opposite side to said first source electrode along the longitudinal direction of said first gate electrode;

said second gate electrode is placed to be adjacent to said first drain electrode on the opposite side to said first gate electrode along the longitudinal direction of said first drain electrode;

said second source electrode is placed to be adjacent to said second gate electrode on the opposite side to said first drain electrode along the longitudinal direction of said second gate electrode;

said first gate electrode is placed to be adjacent to said second source electrode on the opposite side to said second gate electrode along the longitudinal direction of said second source electrode;

said second drain electrode is placed to be adjacent to said first gate electrode on the opposite side to said second source electrode along the longitudinal direction of said first gate electrode;

said second gate electrode is placed to be adjacent to said second drain electrode on the opposite side to said first gate electrode along the longitudinal direction of said second drain electrode, and a circuit having said first source electrode, said second source electrode, said first gate electrode, said second gate electrode, said first drain electrode and said second drain electrode is provided as a third unit circuit;

n pieces of said third unit circuit are placed to be mutually adjacent;

said second gate electrode of an i-th (i is between 1 and n−1) third unit circuit is placed to be adjacent to said first source electrode of an i+1-th third unit circuit; and said n pieces of first drain electrode are mutually connected, said n pieces of second drain electrode are mutually connected, said n pieces of first gate electrode are mutually connected, said n pieces of second gate electrode are mutually connected, said n pieces of first source electrode are mutually connected, and said n pieces of second source electrode are mutually connected.

The 24th aspect of the present invention is a mixer apparatus using the semiconductor differential circuit according to any one of the 1st, the 10th and the 15th aspects of the present invention.

The 25th aspect of the present invention is a circuit apparatus sharing an FET source, using the semiconductor differential circuit according to the 1st aspect of the present invention.

According to the present invention, it is possible to provide the semiconductor differential circuit capable of miniaturizing the IC chip, oscillation apparatus using the semiconductor differential circuit, amplifying apparatus using the semiconductor differential circuit and switching apparatus using the semiconductor differential circuit and semiconductor differential circuit placement method.

DESCRIPTION OF SYMBOLS

1 Semiconductor substrate
2 Parasitic capacitance
3 Parasitic resistance
4 Electrical midpoint
D1, D1', D2, D2' Drain electrodes
G1, G1', G2, G2' Gate electrodes
S, S1, S2, S3 Source electrodes
11, 12, 13 Semiconductor differential circuits

PREFERRED EMBODIMENTS OF THE INVENTION

First Embodiment

Figure 1A:
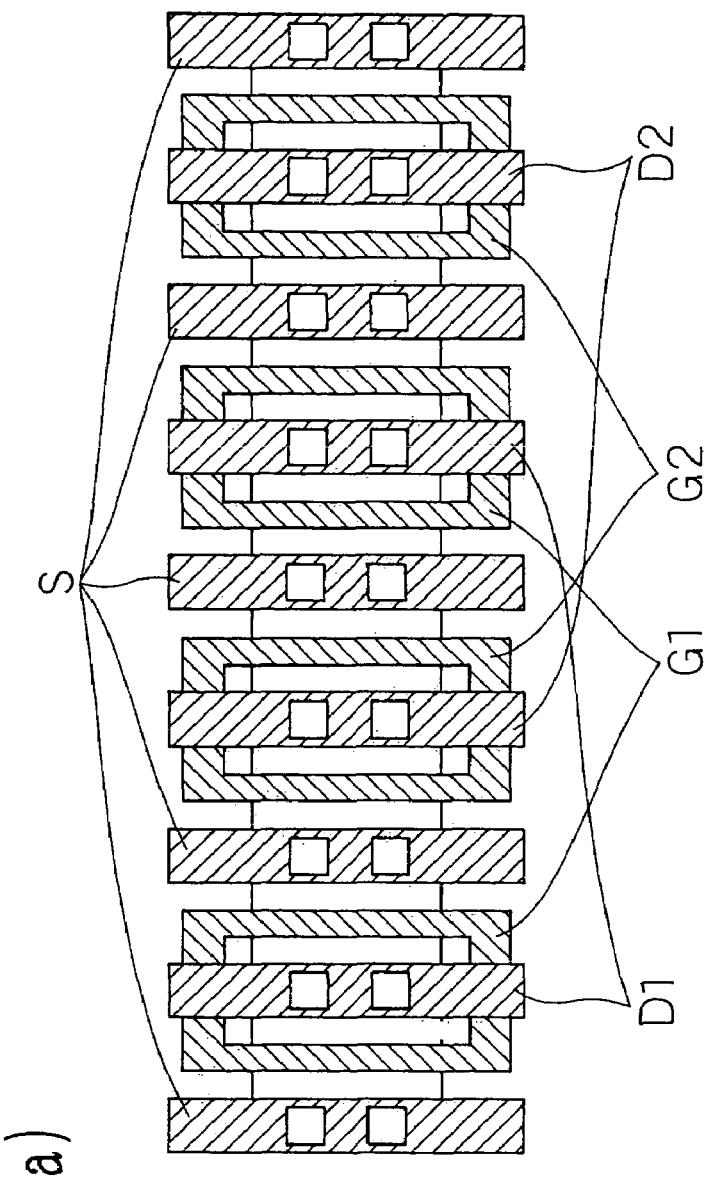
FIG. 1(a) is a plan view showing a configuration of a semiconductor differential circuit according to a first embodiment of the present invention.
Figure 1B:
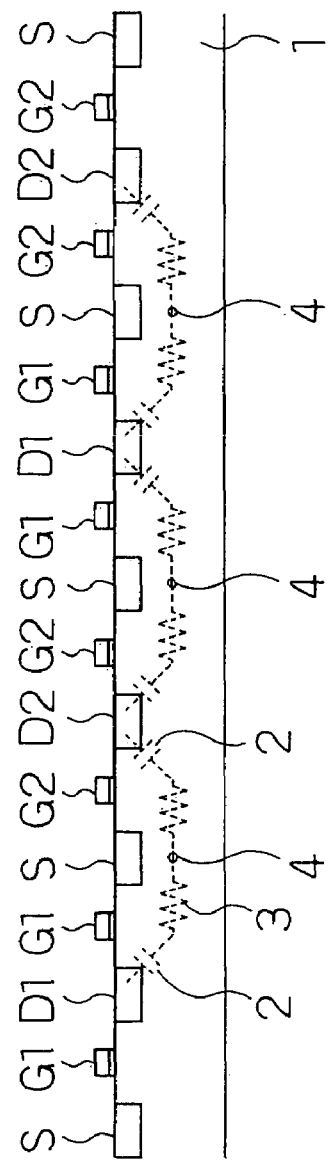
FIG. 1(b) is a sectional view showing the configuration of the semiconductor differential circuit according to the first embodiment of the present invention.

FIG. 1(a) is a plan view and FIG. 1(b) is a sectional view of a multi-finger type semiconductor differential circuit according to a first embodiment of the present invention. The semiconductor differential circuit shown in FIGS. 1(a)–1(b) has a first drain electrode D1 in a longitudinal shape placed on a semiconductor substrate 1, a gate electrode G1 in a longitudinal shape which is an example of a first gate electrode of the present invention is placed to be adjacent to the drain electrode D1 on both sides of the drain electrode D1, and a source electrode S in a longitudinal shape which is an example of a first source electrode of the present invention is placed to be adjacent to each gate electrode G1. To be more specific, a configuration having the source electrode S, gate electrode G1, drain electrode D1, gate electrode G1 and source electrode S is an example showing the configuration of a first semiconductor device of the present invention.

A second drain electrode D2 in a longitudinal shape is placed on the semiconductor substrate 1, a gate electrode G2 in a longitudinal shape which is an example of a second gate electrode of the present invention is placed to be adjacent to the drain electrode D2 on both sides of the drain electrode D2, and the source electrode S in the longitudinal shape which is an example of a second source electrode of the present invention is placed to be adjacent to each gate electrode G2. To be more specific, a configuration having the source electrode S, gate electrode G2, drain electrode D2, gate electrode G2 and source electrode S is an example showing the configuration of a second semiconductor device of the present invention.

Here, if the above circuit comprising the first semiconductor device and second semiconductor device of the present invention is a first unit circuit, the circuit shown in FIG. 1 has the configuration in which a 1st first unit circuit and a 2nd first unit circuit are adjacently placed. In FIGS. 1(a)–1(b), the source electrode S at the right edge of the first semiconductor device and the source electrode S at the left edge of the second semiconductor device are shared. And the source electrode S at the right edge of the 1st first unit circuit and the source electrode S at the left edge of the 2nd first unit circuit are shared.

In this case, the drain electrode D1 and drain electrode D2 are placed as close as possible. One of differential signals is inputted to the drain electrode D1, and the other of the differential signals is inputted to the drain electrode D2. In the first unit circuit, the drain electrodes D1 are mutually connected, the drain electrodes D2 are mutually connected, the gate electrodes G1 are mutually connected, and the gate electrodes G2 are mutually connected.

Next, operation of the semiconductor differential circuit constituted as above and illustrated in FIG. 1 will be described. One of the differential signals is conveyed to the drain electrode D1, and the other of the differential signals is conveyed to the drain electrode D2. Then, at a point where electrical lengths from the drain electrodes D1 and D2 are equal (hereafter referred to as an electrical midpoint), it becomes equivalent to being grounded because the differential signals counteract each other. To describe it by referring to FIG. 1(b) for instance, it can be considered that the drain electrodes D1 and D2 are connected via a parasitic capacitance 2 and a parasitic resistance 3 in a high-frequency area. As the drain electrodes D1 and D2 are formed in the same process on the semiconductor substrate 1, it can be considered that the parasitic capacitances 2 thereof are equal. Therefore, it is equivalent to being grounded (hereafter referred to as virtual grounding) at a midpoint of the parasitic resistance 3 between the drain electrodes D1 and D2 via the semiconductor substrate 1 or at an electrical midpoint 4 of the drain electrodes D1 and D2 inside the semiconductor substrate 1. Thus, if the resistance determined by space between the drain electrodes D1 and D2 inside the semiconductor substrate 1 is R, the drain electrodes D1 and D2 are equivalent to being grounded via resistance of R/2 (corresponding to a first predetermined resistance value of the present invention) respectively.

Thus, the semiconductor differential circuit according to this embodiment can connect to ground without requiring the contactors 1035 connected to the grounding side, and no longer needs grounding area for the contactors 1035 and silicon substrate wiring 1036 so that the IC chip can be miniaturized. Furthermore, the value of the parasitic resistance 3 can be reduced to a half, and so the resistance value thereof can further be reduced. Consequently, a Q-value of a resonator can be increased so as to improve the characteristic deterioration of an oscillation apparatus and an amplifying apparatus.

It was described that, in the configuration shown in FIGS. 1(a)–1(b), the first semiconductor device has the configuration in which the gate electrodes G1 are placed on both sides of the drain electrode D1 respectively. However, the first semiconductor device may have the configuration in which the gate electrode G1 is placed on one side of the drain electrode D1. In that case, the first semiconductor device has one source electrode adjacent to the gate electrode G1. The second semiconductor device also has the same configuration as the first semiconductor device.

According to the above description, in the first unit circuit, the drain electrodes D1 are mutually connected, the drain electrodes D2 are mutually connected, the gate electrodes G1 are mutually connected, and the gate electrodes G2 are mutually connected. However, it is also possible to consider the configuration in which the drain electrodes D1 are not mutually connected, the drain electrodes D2 are not mutually connected, the gate electrodes G1 are not mutually connected, and the gate electrodes G2 are not mutually connected. In that case, it may be the configuration in which the 1st first unit circuit is connected in series to the 2nd first unit circuit. To be more specific, it may be the configuration in which an output side of the first semiconductor device of the 1st first unit circuit is connected to an input side of the first semiconductor device of the 2nd first unit circuit, and the output side of the second semiconductor device of the 1st first unit circuit is connected to the input side of the second semiconductor device of the 2nd first unit circuit.

The above showed the case of having the configuration in which two first unit circuits are connected. However, it may also be the configuration in which n pieces (n is 2 or more) of the first unit circuit are connected. In that case, it should be the configuration in which an i+1-th first unit circuit is placed to be adjacent to an i-th (i is between 1 and n−1) first unit circuit.

Second Embodiment

Figure 2:
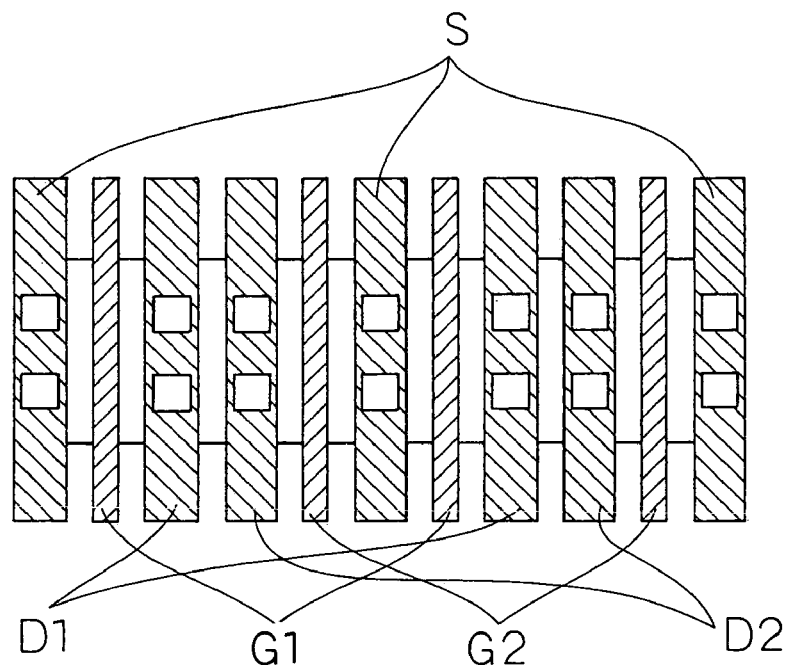
FIG. 2(a) is a plan view showing the configuration of the semiconductor differential circuit according to a second embodiment of the present invention.
FIG. 2(b) is a sectional view showing the configuration of the semiconductor differential circuit according to the second embodiment of the present invention.
Figure 2:
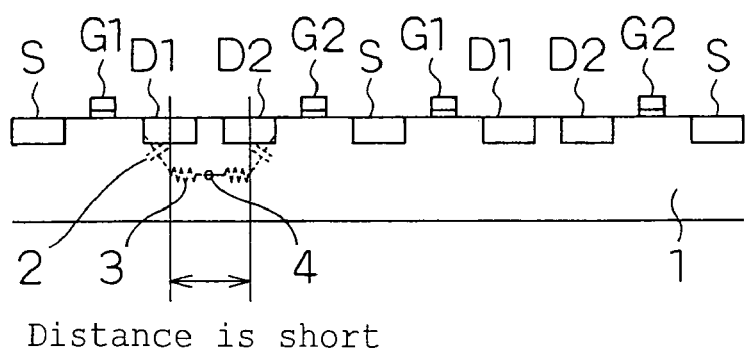

FIG. 2(a) is a plan view and FIG. 2(b) is a sectional view showing the configuration of the multi-finger type semiconductor differential circuit according to a second embodiment of the present invention. The semiconductor differential circuit shown in FIGS. 2(a)–2(b) has the source electrode S which is an example of a third source electrode of the present invention formed on the semiconductor substrate 1, the gate electrode G1 which is an example of the first gate electrode of the present invention placed to be adjacent to the source electrode S along the longitudinal direction of the source electrode S, the drain electrode D1 which is an example of the first drain electrode of the present invention placed to be adjacent to the gate electrode G1 on the opposite side to the source electrode S along the longitudinal direction of the gate electrode G1, the drain electrode D2 which is an example of the second drain electrode of the present invention placed close to the drain electrode D1 on the opposite side to the gate electrode G1 along the longitudinal direction of the drain electrode D1, and the gate electrode G2 which is an example of the second gate electrode of the present invention placed to be adjacent to the drain electrode D2 on the opposite side to the drain electrode D1 along the longitudinal direction of the drain electrode D2.

The configuration in which the source electrode S, gate electrode G1, drain electrode D1, drain electrode D2 and gate electrode G2 are arranged is an example of how a second unit circuit of the present invention is formed.

In the second unit circuit, the drain electrodes D1 are mutually connected, the drain electrodes D2 are mutually connected, the gate electrodes G1 are mutually connected, and the gate electrodes G2 are mutually connected.

According to the semiconductor differential circuit of this embodiment, no other electrode is inserted between the drain electrode D1 and drain electrode D2, and so the drain electrode D1 and drain electrode D2 can be placed closer than those in the case of the semiconductor differential circuit of the first embodiment so as to further improve the Q-value of the resonator. Therefore, the semiconductor differential circuit of this embodiment can further improve the characteristic deterioration of the oscillation apparatus and amplifying apparatus.

The configuration shown in FIGS. 2(a)–2(b) shows an example in which two second unit circuits are placed. However, the semiconductor differential circuit of this embodiment may be comprising n pieces (n is 2 or more) of second unit circuit. In that case, an i+1-th second unit circuit should be placed to be adjacent to an i-th (i is between 1 and n-1) second unit circuit. And the gate electrode G2 of the i-th second unit circuit should be placed to be adjacent to the source electrode S of the i+1-th unit circuit.

Figure 9:
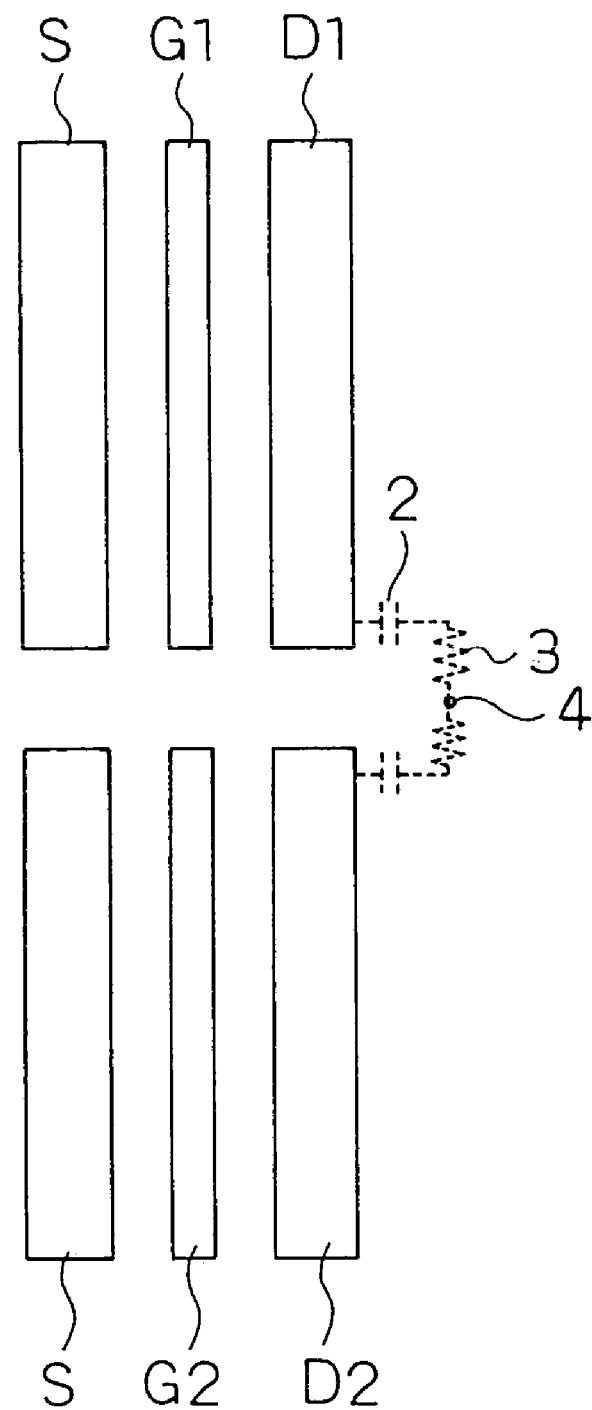
FIG. 9 is a plan view showing another configuration of the semiconductor differential circuit according to the first embodiment of the present invention.

In the above description of the first and second embodiments, it was described that the drain electrode D1 and drain electrode D2 are placed to be close in the longitudinal direction. However, the drain electrode D1 and drain electrode D2 may be close in another direction. For instance, FIG. 9 shows the configuration in which the end portions of the drain electrode D1 and drain electrode D2 are close. Even in such a configuration, the electrical midpoint (that is, a distance midpoint) of the drain electrodes D1 and D2 is a virtual grounding point, and both the drain electrode D1 and drain electrode D2 are equivalent to the state of being connected to the grounding side via the parasitic resistance value R/2 so as to obtain the same effect as in the above case.

In the second unit circuit, the drain electrodes D1 are mutually connected, the drain electrodes D2 are mutually connected, the gate electrodes G1 are mutually connected, and the gate electrodes G2 are mutually connected. However, it is also possible to consider the configuration in which the drain electrodes D1 are not mutually connected, the drain electrodes D2 are not mutually connected, the gate electrodes G1 are not mutually connected, and the gate electrodes G2 are not mutually connected. In that case, the 1st second unit circuit may be connected in series to the 2nd second unit circuit. To be more specific, it may be the configuration in which the output side of the first semiconductor device of the 1st second unit circuit is connected to the input side of the first semiconductor device of the 2nd second unit circuit, and the output side of the second semiconductor device of the 1st second unit circuit is connected to the input side of the second semiconductor device of the 2nd second unit circuit.

The FETs according to the above description were the multi-finger type. However, they may also be the FETs of another type, and the same effect as above can be obtained in that case.

Third Embodiment

Figure 3:
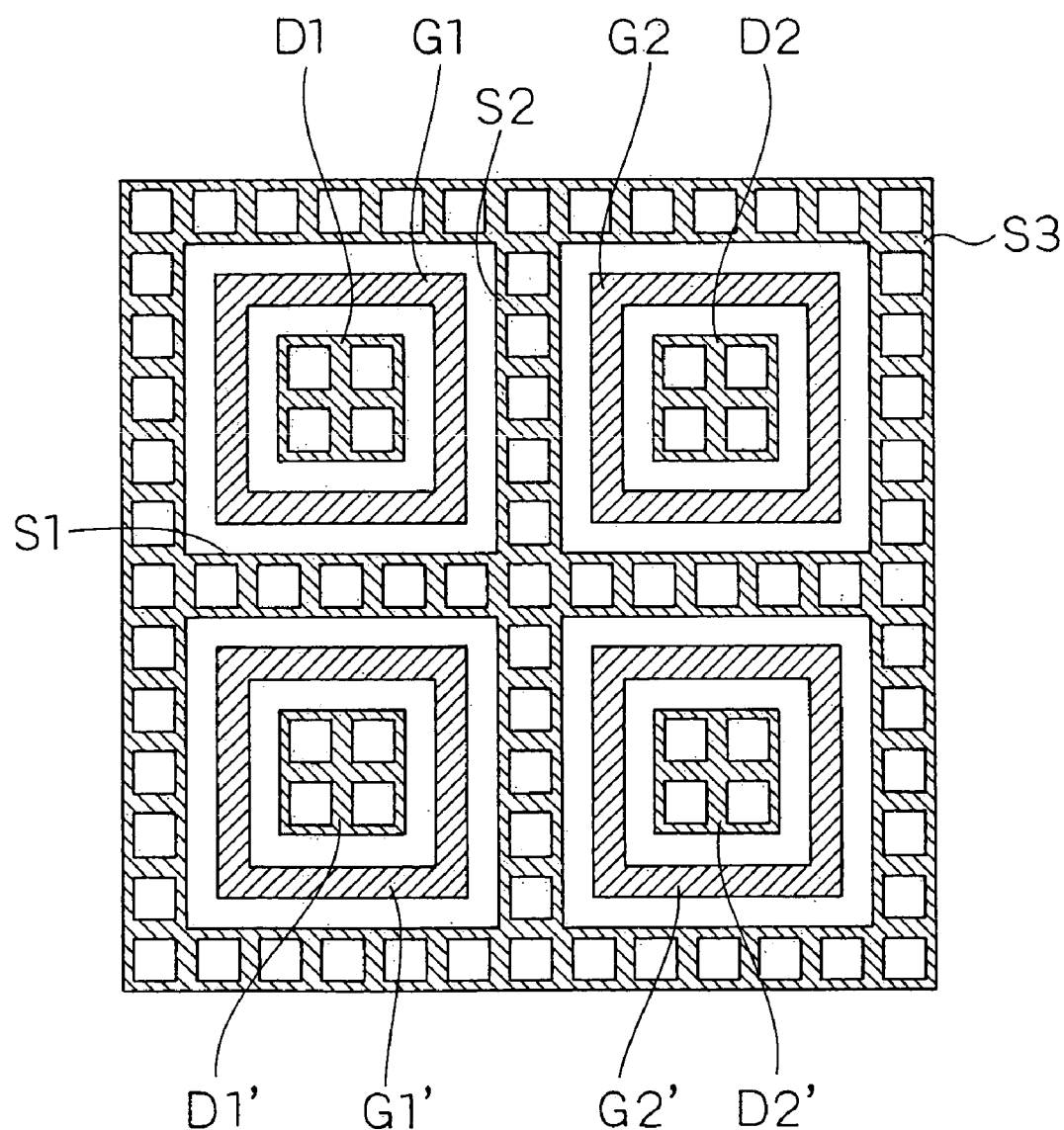
FIG. 3 is a plan view showing the configuration of the semiconductor differential circuit according to a third embodiment of the present invention.

FIG. 3 is a plan view showing the configuration of the semiconductor differential circuit according to a third embodiment of the present invention. The semiconductor differential circuit shown in FIG. 3 has the drain electrode D1 and drain electrode D1' which are examples of rectangular first drain electrodes of the present invention and the drain electrode D2 and drain electrode D2' which are examples of rectangular second electrodes of the present invention. And it has the gate electrode G1 and gate electrodes G1' which are examples of the first gate electrodes of the present invention and placed to surround the drain electrodes D1 and D1' respectively and the gate electrode G2 and gate electrodes G2' which are examples of the second gate electrodes of the present invention and placed to surround the drain electrodes D2 and D2' respectively.

And a source electrode S1 in a longitudinal shape is placed between the gate electrode G1 and gate electrode G1' and between the gate electrode G2 and gate electrode G2', and a source electrode S2 in a longitudinal shape connected to the source electrode S1 to cross it is placed between the gate electrode G1 and gate electrodes G2 and between the gate electrode G1' and gate electrodes G2'.

And a source electrode S3 is placed to surround the gate electrodes G1, G1', G2, G2' and the source electrodes S1, S2. The source electrode S1 and S2 are connected to the source electrode S3. The source electrode shown in FIG. 3 formed by the source electrodes S1, S2 and S3 is constituted as an example of the source electrode of the present invention.

Here, the drain electrode D1 and drain electrode D2 are placed close so that the midpoint (or a midline) connecting them becomes a virtual grounding point (or a virtual grounding line). The drain electrode D1' and D2' are also placed close likewise. Therefore, the above virtual grounding line extends up and down approximately along the source electrode S2.

According to such a semiconductor differential circuit of this embodiment, each drain electrode has only to be surrounded by each gate electrode. Therefore, each drain electrode can be constituted with sufficiently small area. It is possible, by rendering the area of each drain electrode smaller, to reduce the parasitic capacitance 2 with the semiconductor substrate 1 so as to constitute an oscillating circuit and the amplifier circuit with further reduced characteristic deterioration.

In the above description, it was described that the virtual grounding line is along the source electrode S2. However, the virtual grounding line may also be formed along the source electrode S1.

Figure 4:
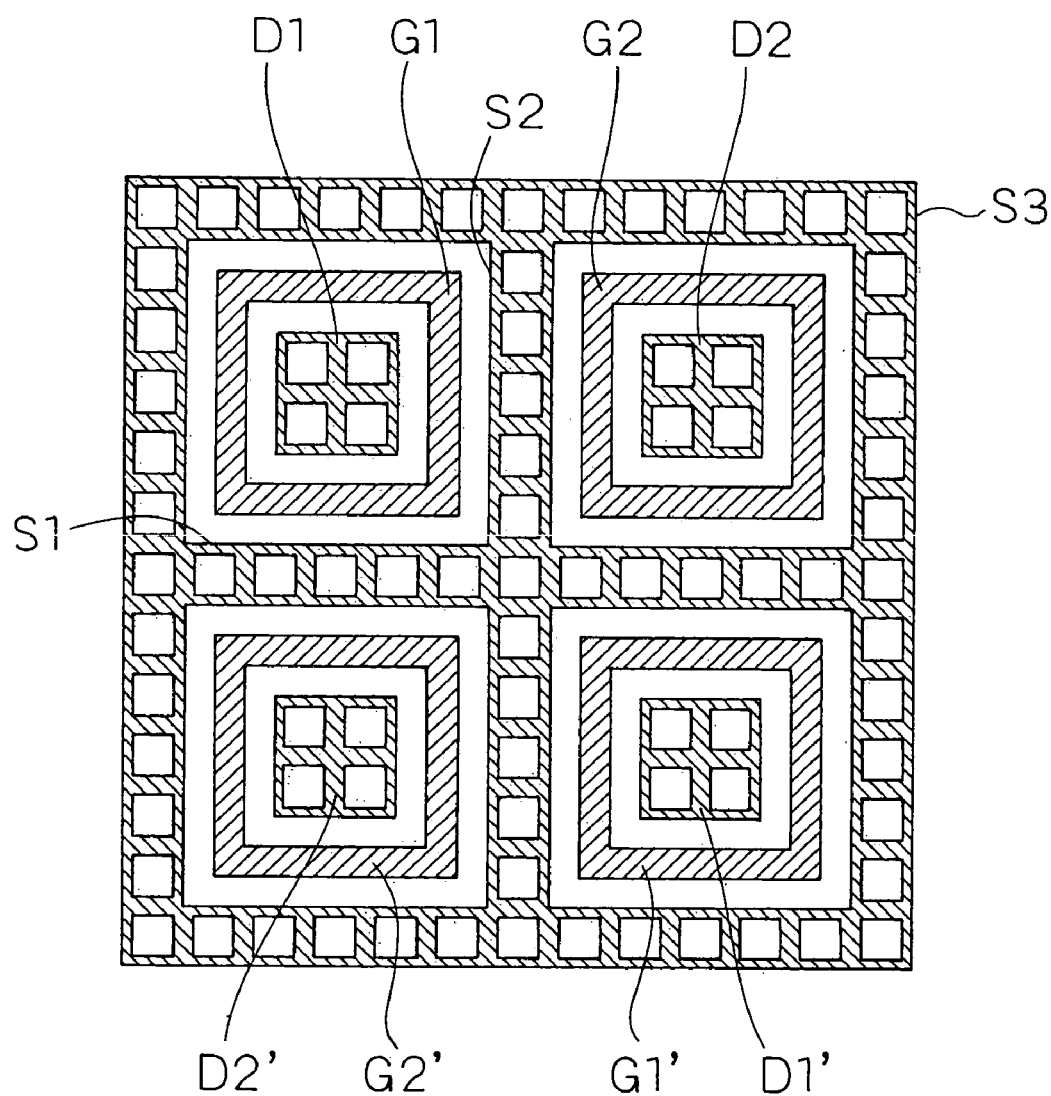
FIG. 4 is a plan view showing the configuration of the semiconductor differential circuit according to the third embodiment of the present invention.

Furthermore, the virtual grounding line may also be formed along the source electrode S1 and source electrode S2 respectively. FIG. 4 shows the configuration in that case. The semiconductor differential circuit shown in FIG. 4 has the configuration in which the drain electrode D1 and drain electrode D1' of the semiconductor differential circuit shown in FIG. 3 are diagonally placed, and the drain electrode D2 and drain electrode D2' are diagonally placed. To be more specific, the source electrode S2 is placed between the drain electrode D1 which is an example of one of the first drain electrodes of the present invention and the drain electrode D2 which is an example of one of the second drain electrodes of the present invention, the source electrode S2 is placed between the drain electrode D1' which is an example of the other of the first drain electrodes of the present invention and the drain electrode D2' which is an example of the other of the second drain electrodes of the present invention, the source electrode S1 connected to the source electrode S2 is placed between the drain electrode D1 and the drain electrode D2', and the source electrode S1 is placed between the drain electrode D1' and the drain electrode D2.

A virtual midline is formed approximately along the source electrode S2 and source electrode S1 by thus placing the drain electrodes. The virtual midline is thereby increased so that the drains and the grounding side are connected via the parasitic resistance value R/2 in a wider range. For this reason, it is possible, according to the semiconductor differential circuit shown in FIG. 4, to constitute the oscillating circuit and amplifier circuit with further reduced characteristic deterioration.

According to the above description of this embodiment, the drain electrodes are rectangular. However, the drain electrodes may be in any shape as long as they are surrounded by the gate electrodes. And the same effect as above can be obtained in that case.

According to the above description, there four drain electrodes in the configuration in the example in FIG. 3 for instance. However, it may be a different number of pieces. In that case, the gate electrodes should be placed to surround the drain electrodes, and the source electrode should be placed between the first gate electrode and second gate electrode. And same effect as above can be obtained in that case.

Figure 5:
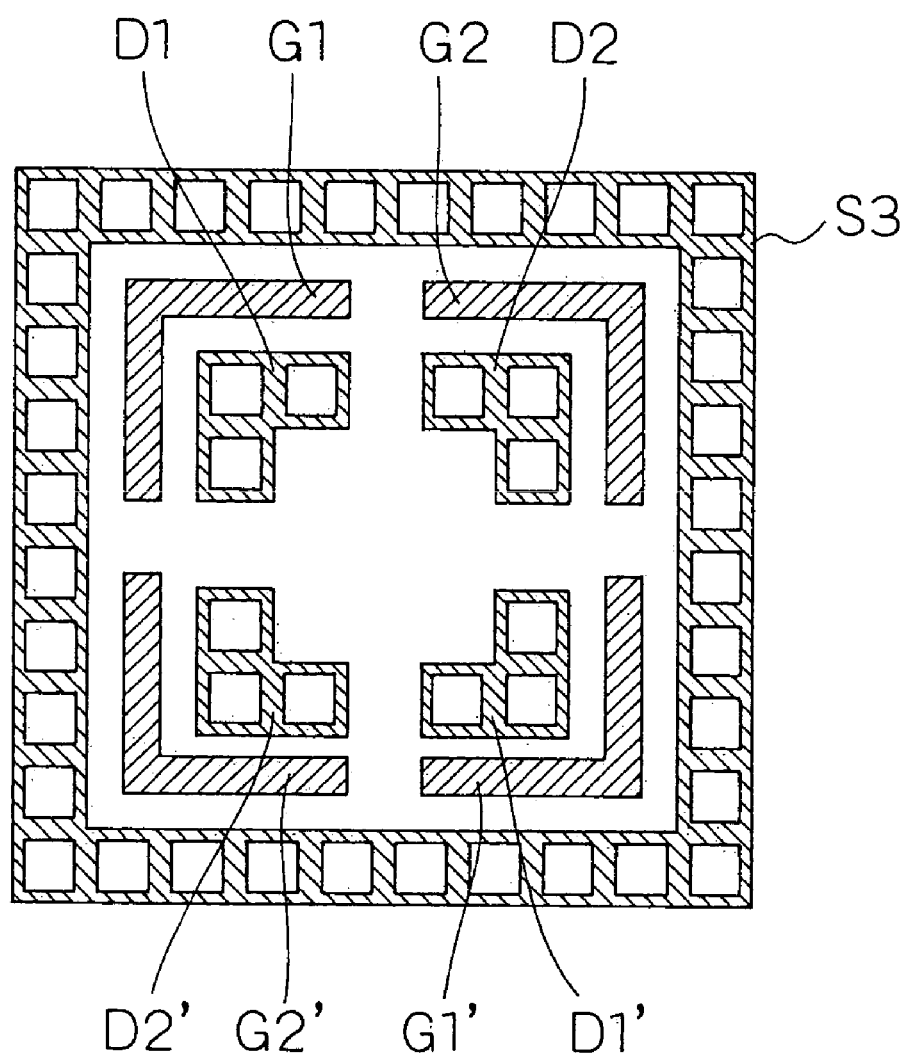
FIG. 5 is a plan view showing the configuration of the semiconductor differential circuit according to the third embodiment of the present invention.

The configuration shown in FIG. 5 has the source electrode S1 and source electrode S2 eliminated from the configuration shown in FIG. 4. In the configuration shown in FIG. 5, the shape of each gate electrode is not the one for surrounding each drain electrode, but each gate electrode is placed to be sandwiched by each drain electrode and the source electrode S3. To be more specific, the drain electrode D1 which is an example of one of the first drain electrode of the present invention and the drain electrode D2 which is an example of one of the second drain electrode of the present invention are placed close, the drain electrode D1' which is an example of the other of the first drain electrode of the present invention and the drain electrode D2' which is an example of the other of the second drain electrode of the present invention are placed close, the drain electrode D1 and drain electrode D2' are placed close, and the drain electrode D1' and drain electrode D2 are placed close.

According to the semiconductor differential circuit of such a configuration, the source electrodes S1 and S2 do not exist among the drain electrodes. Therefore, it is possible to place the drain electrodes closer so as to further reduce the parasitic resistance 3. Thus, it is possible, by using the semiconductor differential circuit shown in FIG. 5, to provide the oscillating circuit and amplifier circuit with further reduced characteristic deterioration. In this case, the numbers, shapes and placements of the drain electrodes are not limited to those shown in FIG. 5, but other numbers, shapes and placements may be taken and the same effect as above can be obtained in that case as long as the first drain electrode and second drain electrode are placed close and the source electrodes are placed to surround the drain electrodes and gate electrodes.

Fourth Embodiment

Figure 6:
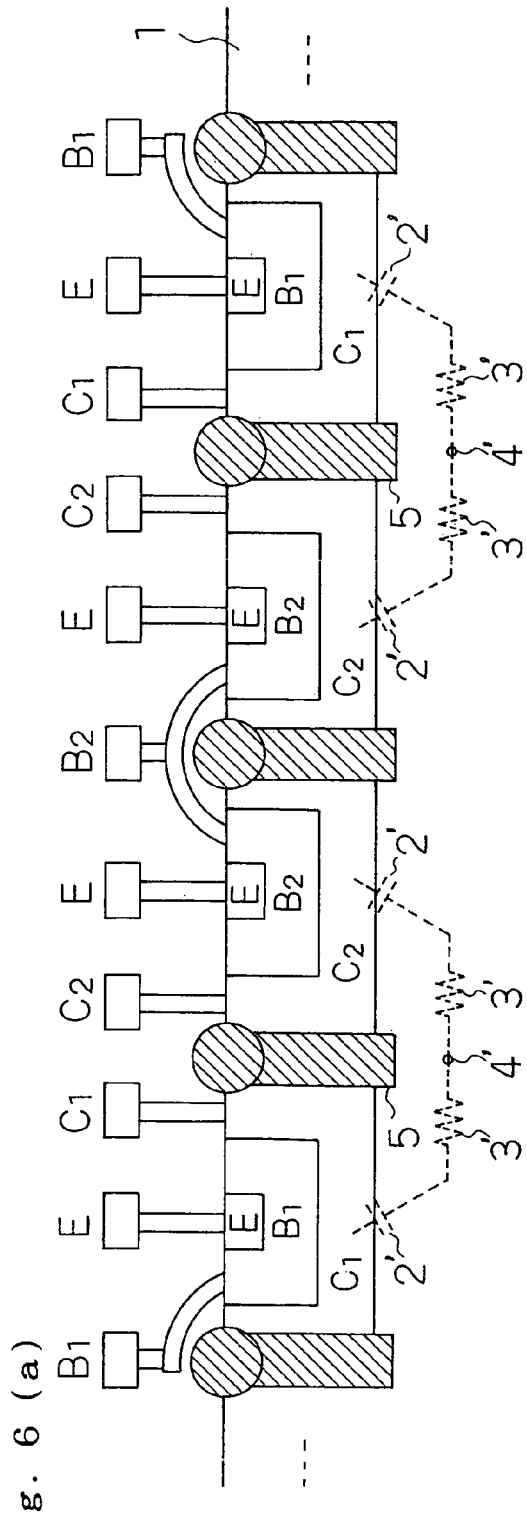
FIG. 6(a) is a sectional view showing the configuration of the semiconductor differential circuit according to a fourth embodiment of the present invention.
FIG. 6(b) is a sectional view showing the configuration of the semiconductor differential circuit according to the fourth embodiment of the present invention.
Figure 6:
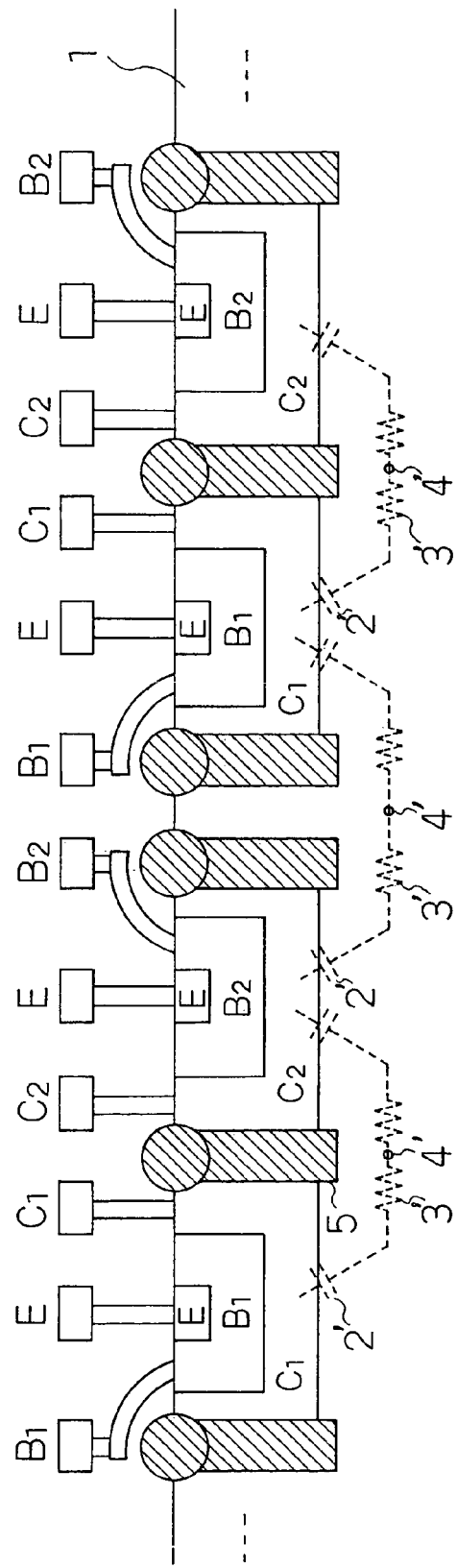

FIGS. 6(*a*)–6(*b*) are sectional views showing the configuration of the semiconductor differential circuit according to a fourth embodiment of the present invention. The semiconductor differential circuit of this embodiment is the semiconductor differential circuit according to the first to third embodiments constituted by bipolar transistors. As for the semiconductor differential circuit shown in FIG. 6(*a*), a collector C1 as an example of a first collector of the present invention is formed like a well on the semiconductor substrate 1, a base B1 as an example of a first base of the present invention is formed like a well on the collector C1, and an emitter E is formed like a well on the base B1. In this case, one of the differential signals is inputted to the collector C1, and the collector C1, base B1 and emitter E are forming the first semiconductor device of the present invention.

A collector C2 as an example of a second collector of the present invention is formed like a well next to the collector C1, a base B2 as an example of a second base of the present invention is formed like a well on the collector C2, and the emitter E is formed like a well on the base B2. In this case, the other of the differential signals is inputted to the collector C2, and the collector C2, base B2 and emitter E are forming the second semiconductor device of the present invention. And an insulating layer 5 is provided between the collector C1 and collector C2, but the collector C1 and collector C2 are placed as close as possible. The first semiconductors and second semiconductors are placed so that the collectors thereof are repeatedly placed in order of C1, C2, C2 and C1.

Consequently, the collector C1 becomes equivalent, as to a high-frequency signal component, to being grounded at a parasitic resistance value R'/2 (corresponding to a second predetermined resistance value of the present invention) which is half the parasitic resistance value R' determined by the distance of the collector C1 and collector C2 in the semiconductor substrate 1, and the collector C2 likewise becomes equivalent to being grounded at the parasitic resistance value R'/2. Consequently, the Q-value of the resonant circuit can be increased as in the cases of the first to third embodiments.

FIG. 6(*b*) shows the semiconductor differential circuit formed by bipolar transistors of another example. As for the semiconductor differential circuit shown in FIG. 6(*b*), the first semiconductor and second semiconductor are placed so that the collectors thereof are repeatedly placed in order of C1, C2, C1 and C2. According to such a configuration, more electrical midpoints 4' are formed compared to the case according to the configuration shown in FIG. 6(*a*) so as to provide the oscillator and amplifier with further reduced characteristic deterioration.

Figure 7:
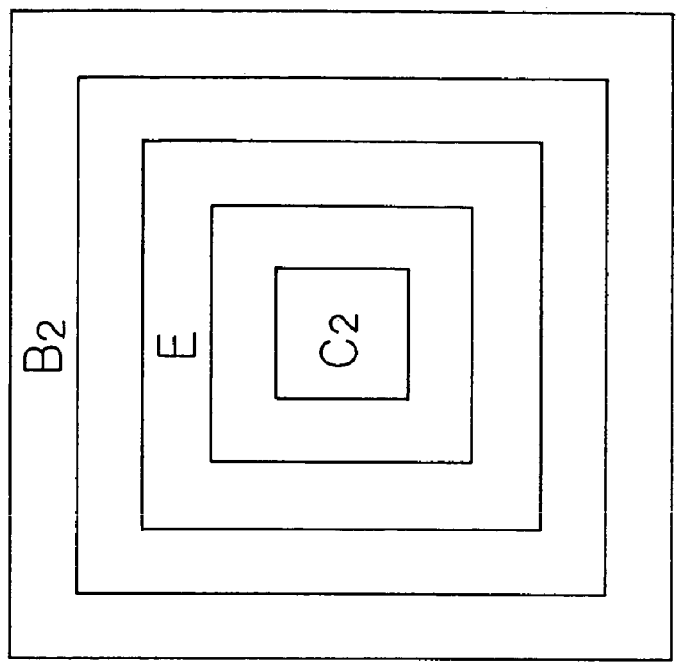
FIG. 7 is a plan view showing the configuration of the semiconductor differential circuit according to the fourth embodiment of the present invention.
Figure 7:
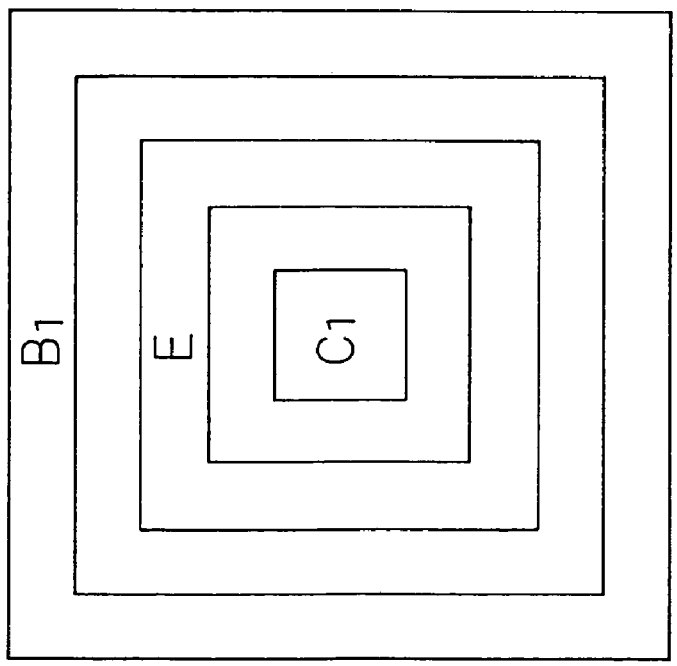

The above described the configuration in which each collector is formed as a well on the semiconductor substrate 1. However, it may also be the configuration in which each base is formed as a well on the semiconductor substrate 1. In that case, each base is placed at the position of each collector in FIGS. 6(*a*) and 6(*b*), each emitter is placed at the position of each base, and each collector is placed at the position of each emitter. FIG. 7 shows a plan view of the semiconductor differential circuit shown from above in such a case. And it is the configuration in which the base B1 as an example of the first base of the present invention and the base B2 as an example of the second base of the present invention are close, where the same effect as above can be obtained.

Figure 8:
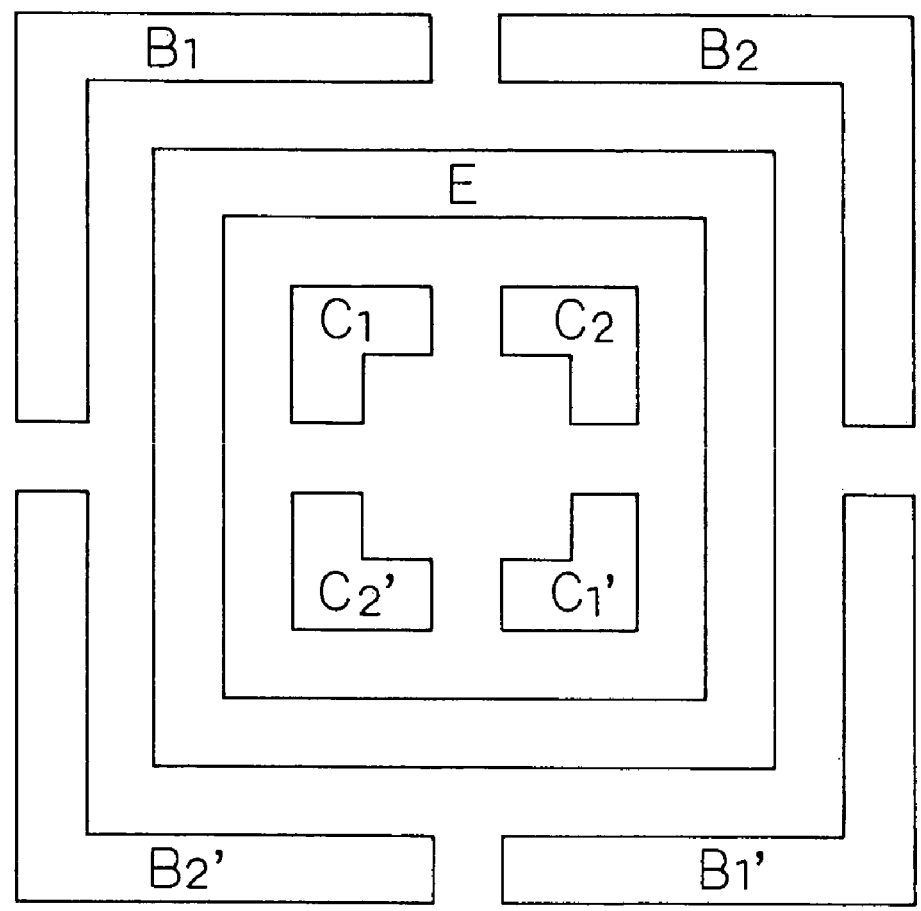
FIG. 8 is a plan view showing the configuration of the semiconductor differential circuit according to the fourth embodiment of the present invention.

It is also possible, as shown in FIG. 8, to diagonally place the base B1 and base B1' to which one of the differential signals is conveyed and diagonally place the base B2 and base B2' to which the other of the differential signals is conveyed. The same effect as above can be obtained from such a configuration.

Figure 10:
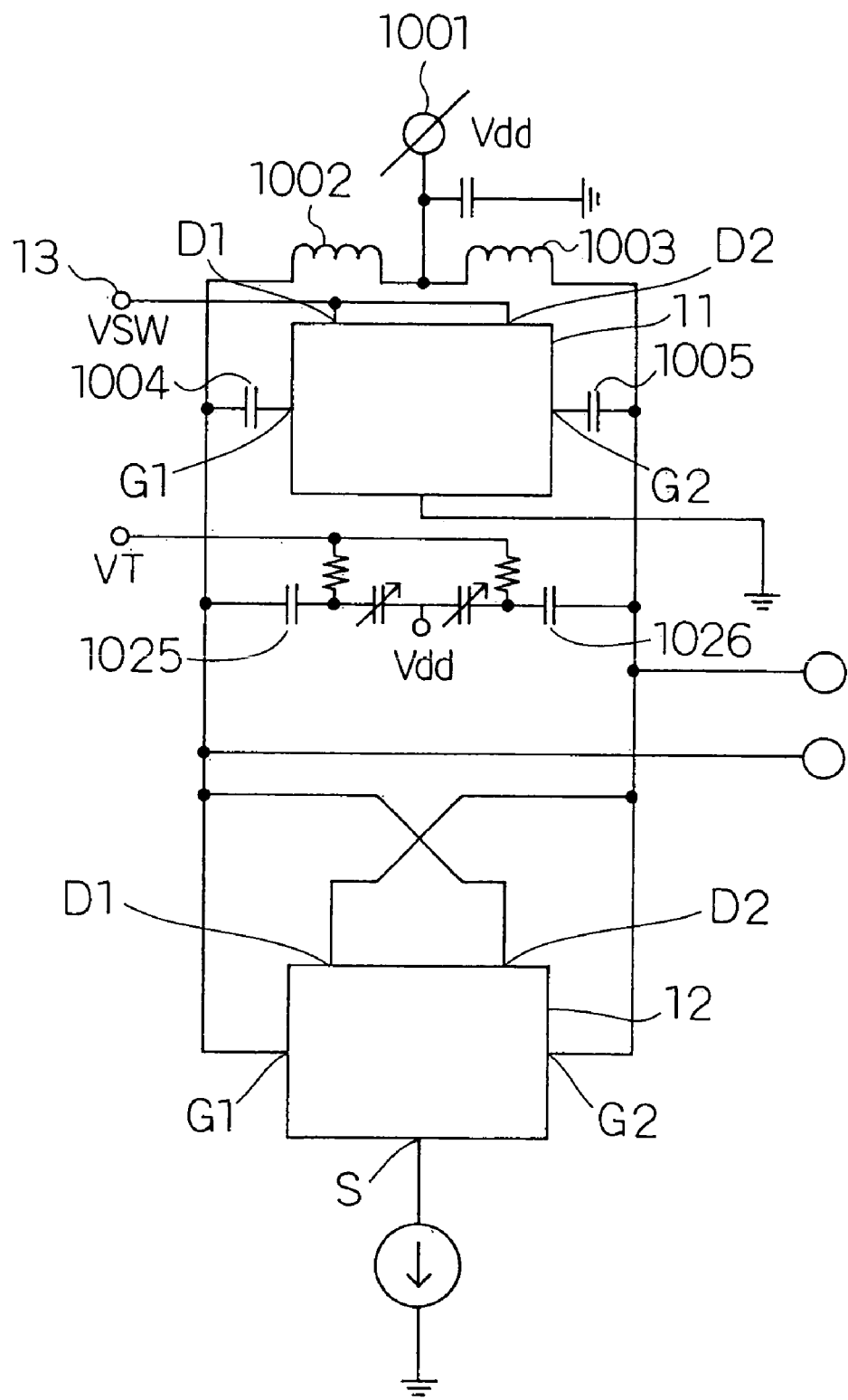
FIG. 10 is a diagram showing a circuit configuration of an oscillation apparatus using the semiconductor differential circuit of the present invention.
Figure 12:
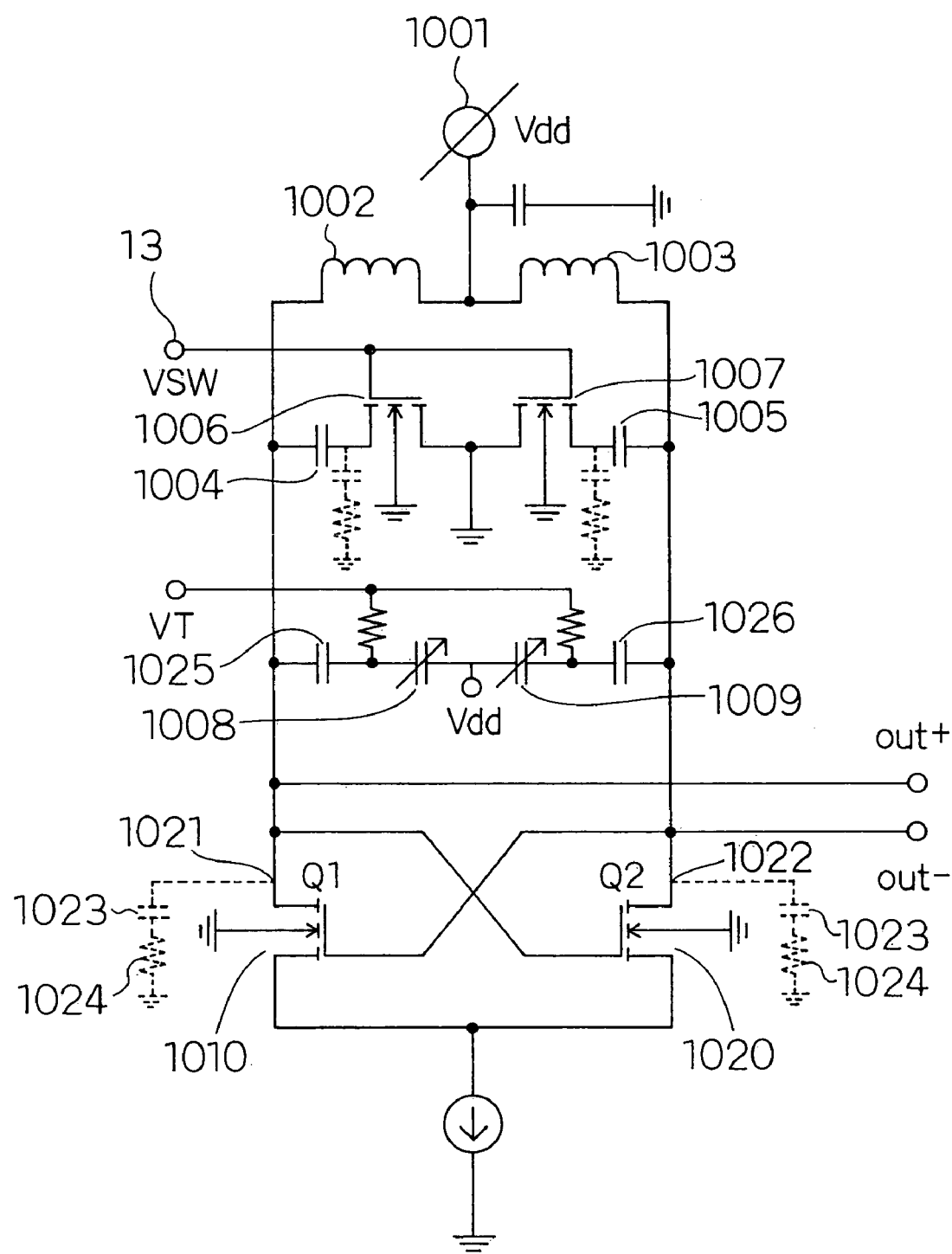
FIG. 12 is a diagram showing the circuit configuration of the oscillation apparatus of the prior art.

The oscillation apparatus and amplifying apparatus using the semiconductor differential circuits described in the first to fourth embodiments belong to the category of the present invention. FIG. 10 shows an example of circuit configuration of the oscillation apparatus using the semiconductor differential circuit of the present invention. In the circuit shown in FIG. 10, the portion comprising switching elements 1006 and 1007 in the circuit shown in FIG. 12 is replaced by a semiconductor differential circuit 11 of the present invention, and the portion comprising MOSFETs 1010 and 1020 therein is replaced by a semiconductor differential circuit 12 of the present invention. The semiconductor differential circuit 11 has a control voltage terminal 13 connected thereto, and is capable of switching a frequency band of an oscillation frequency with control voltage applied to a control voltage terminal 13. The semiconductor differential circuit 12 has a reduced parasitic resistance value as described above so that the Q-value of the resonant circuit can be increased enough to curb the characteristic deterioration of the oscillating circuit.

Figure 11:
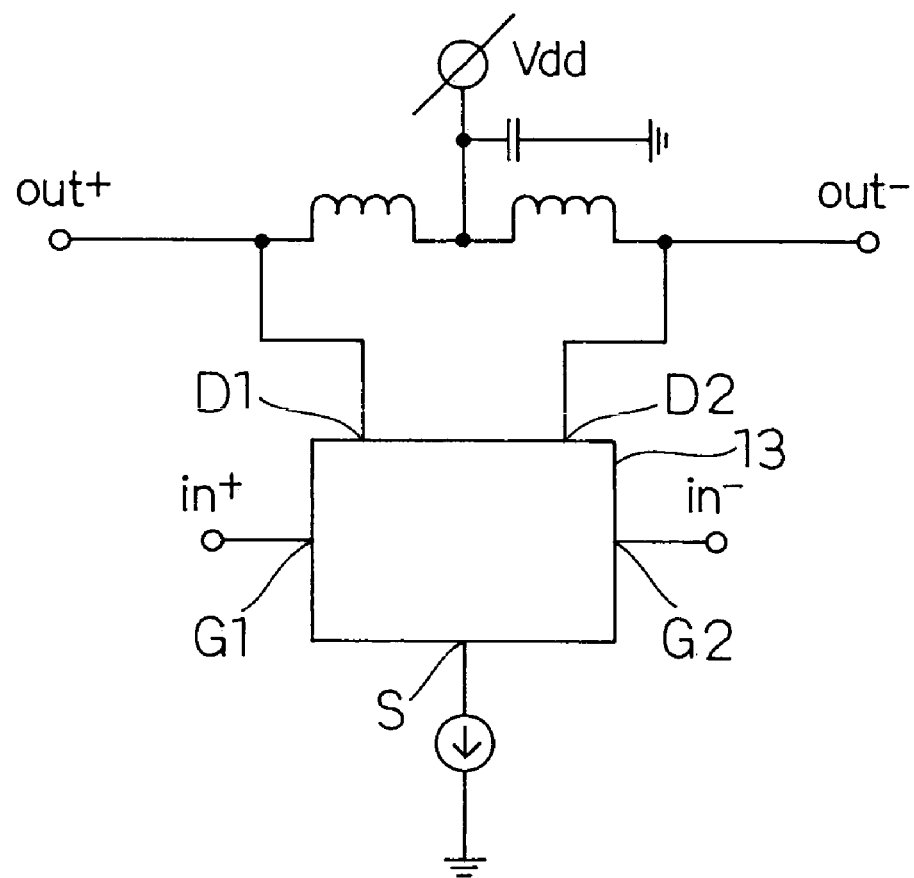
FIG. 11 is a diagram showing the circuit configuration of an amplifier apparatus using the semiconductor differential circuit of the present invention.
Figure 13:
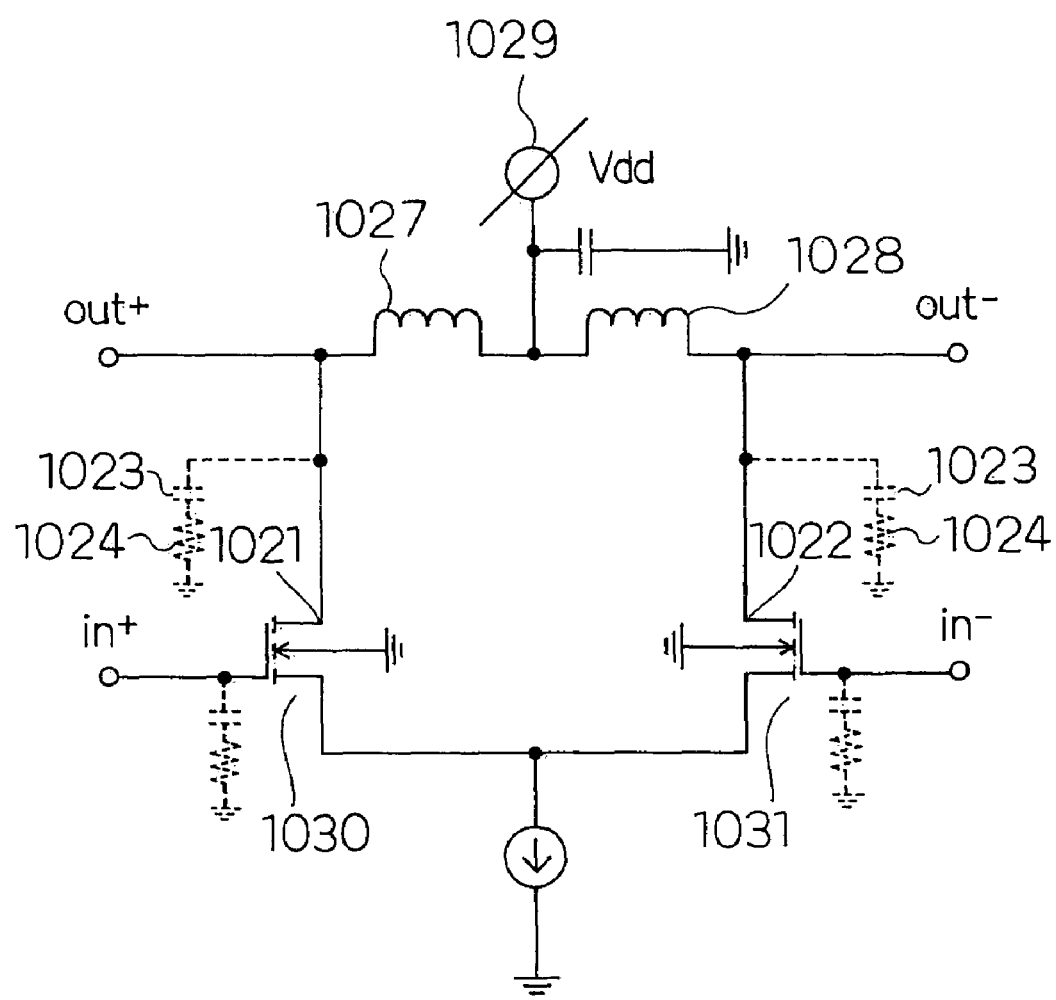
FIG. 13 is a diagram showing the circuit configuration of the amplifier apparatus of the prior art.
Figure 14:
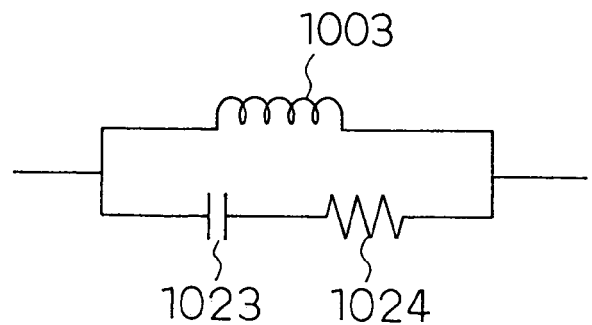
FIG. 14 shows an equivalent circuit of a circuit element considering influence of a parasitic component in the oscillation apparatus or amplifier apparatus of the prior art.
Figure 15:
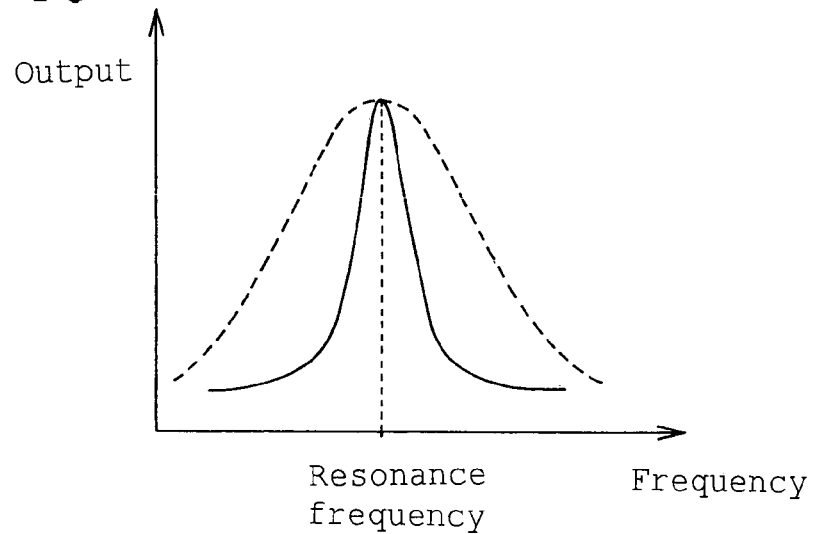
FIG. 15 is a diagram showing the influence of change in a Q-value on a resonance frequency characteristic of a resonant circuit used for the oscillation apparatus of the present invention or the prior art.
Figure 16:
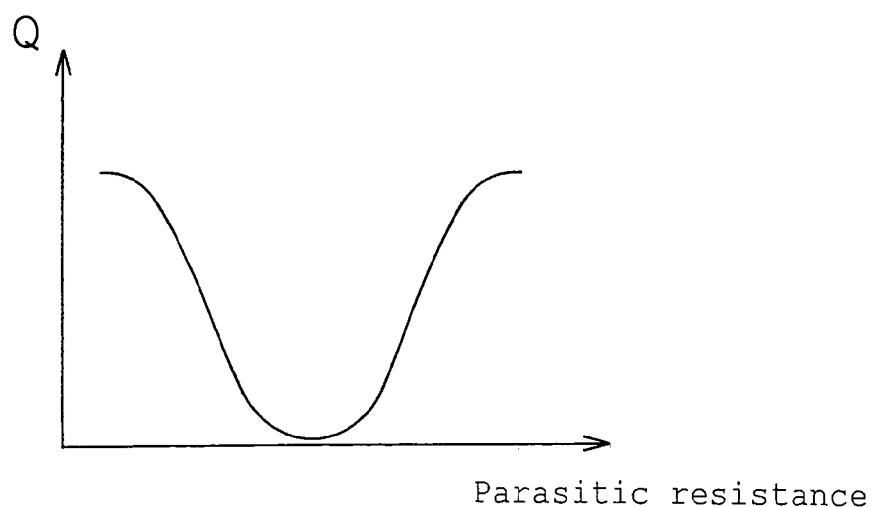
FIG. 16 is a diagram showing the influence of a parasitic resistance on a Q-value of the resonant circuit used for the oscillation apparatus of the present invention or the prior art.
Figure 17:
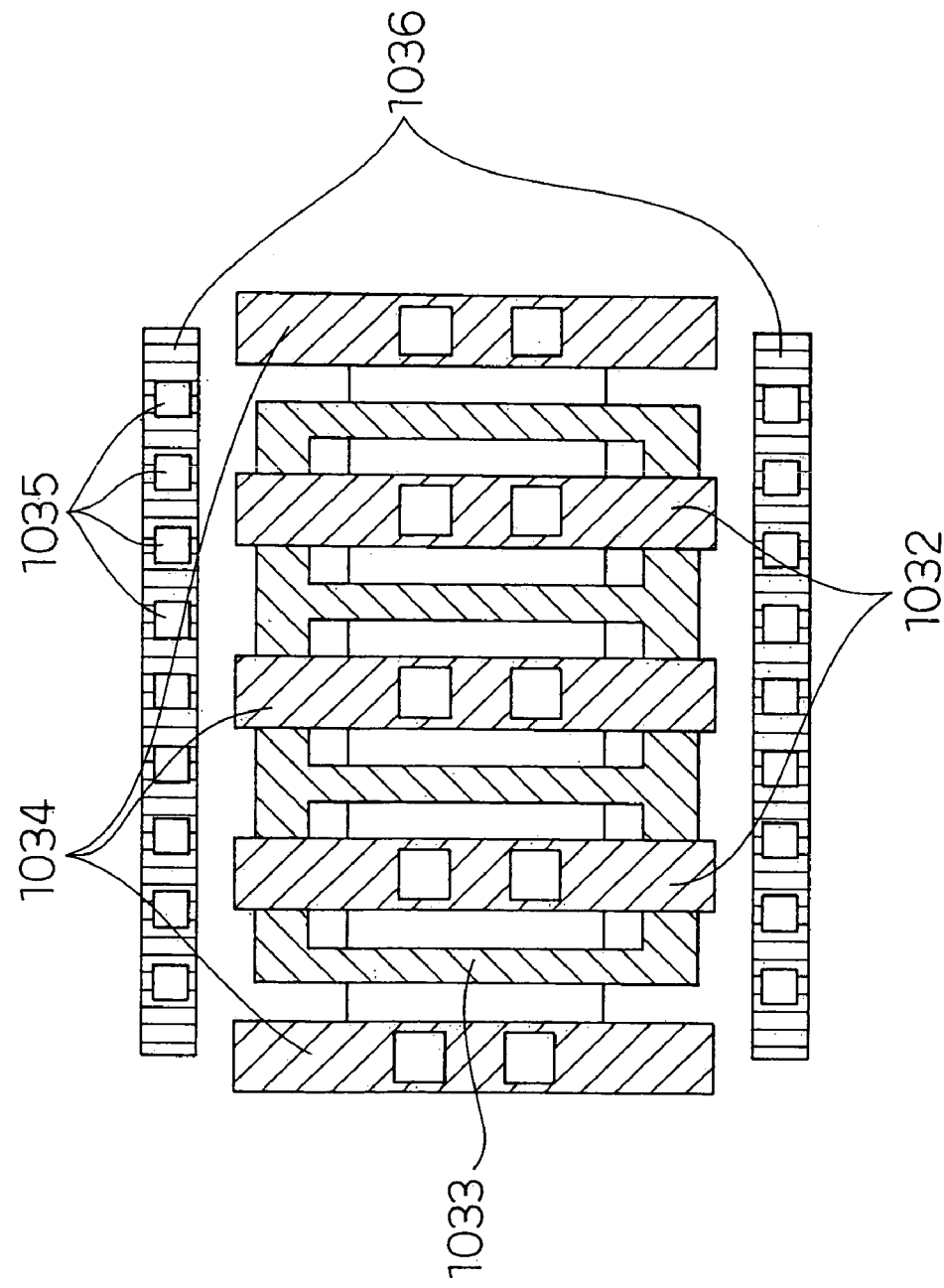
FIG. 17 is a plan view showing the configuration of a multi-finger type FET of the prior art.
Figure 18:
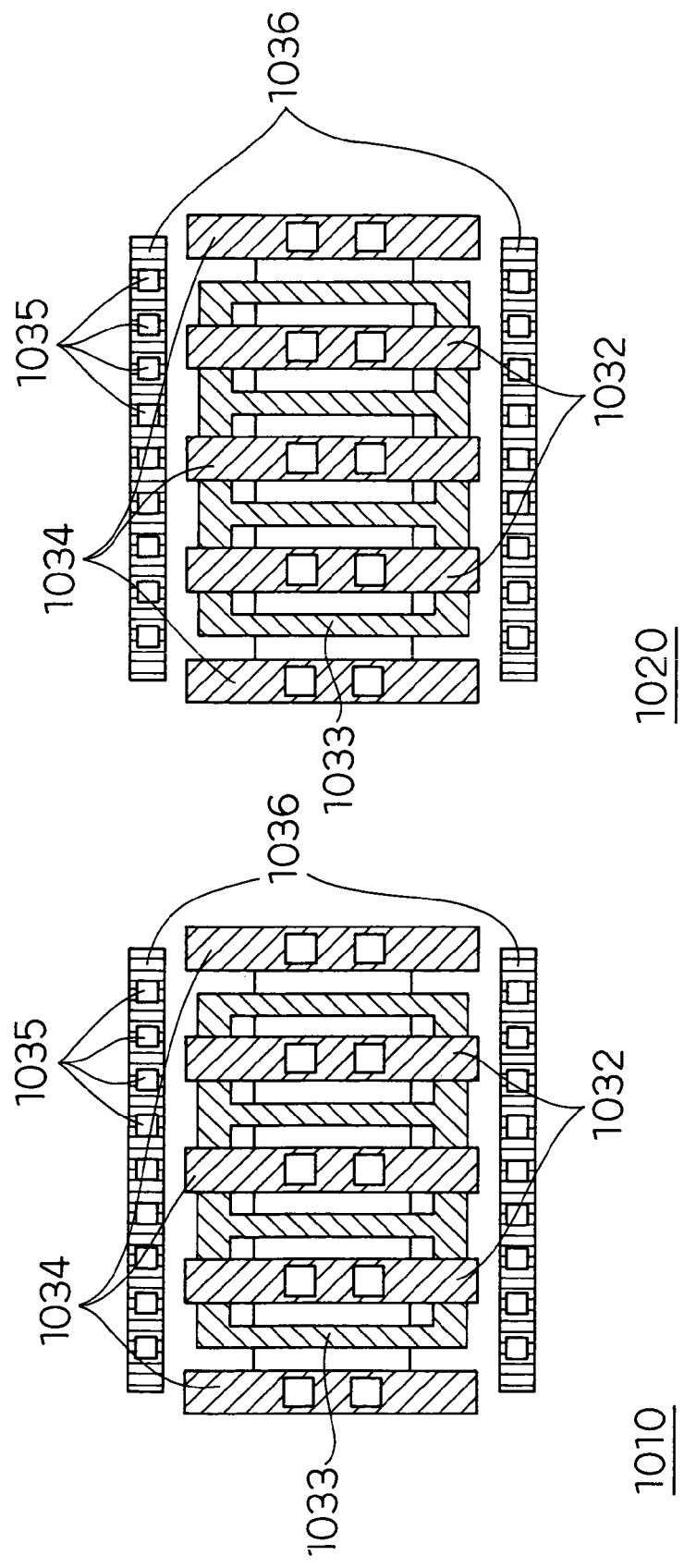
FIG. 18 is a plan view showing a placement when the multi-finger type FET of the prior art has a differential configuration.

FIG. 11 shows a circuit configuration example of the amplifying apparatus using the semiconductor differential circuit of the present invention. In the circuit shown in FIG. 11, the portion comprising MOSFETs 1030 and 1031 in the circuit shown in FIG. 13 is replaced by a semiconductor differential circuit 13 of the present invention. Such an amplifying apparatus can reduce the loss due to the parasitic resistance and curb the characteristic deterioration of the amplifying apparatus as described above.

In the case of using the semiconductor differential circuit of the present invention as a switching apparatus, it is possible to reduce the loss due to the parasitic resistance and parasitic capacitance when the switching element is on. It is also possible, in the case of using the switching apparatus and the above-mentioned oscillation apparatus in combination for instance, to curb the characteristic deterioration of the oscillating circuit.

Fifth Embodiment

Figure 19:
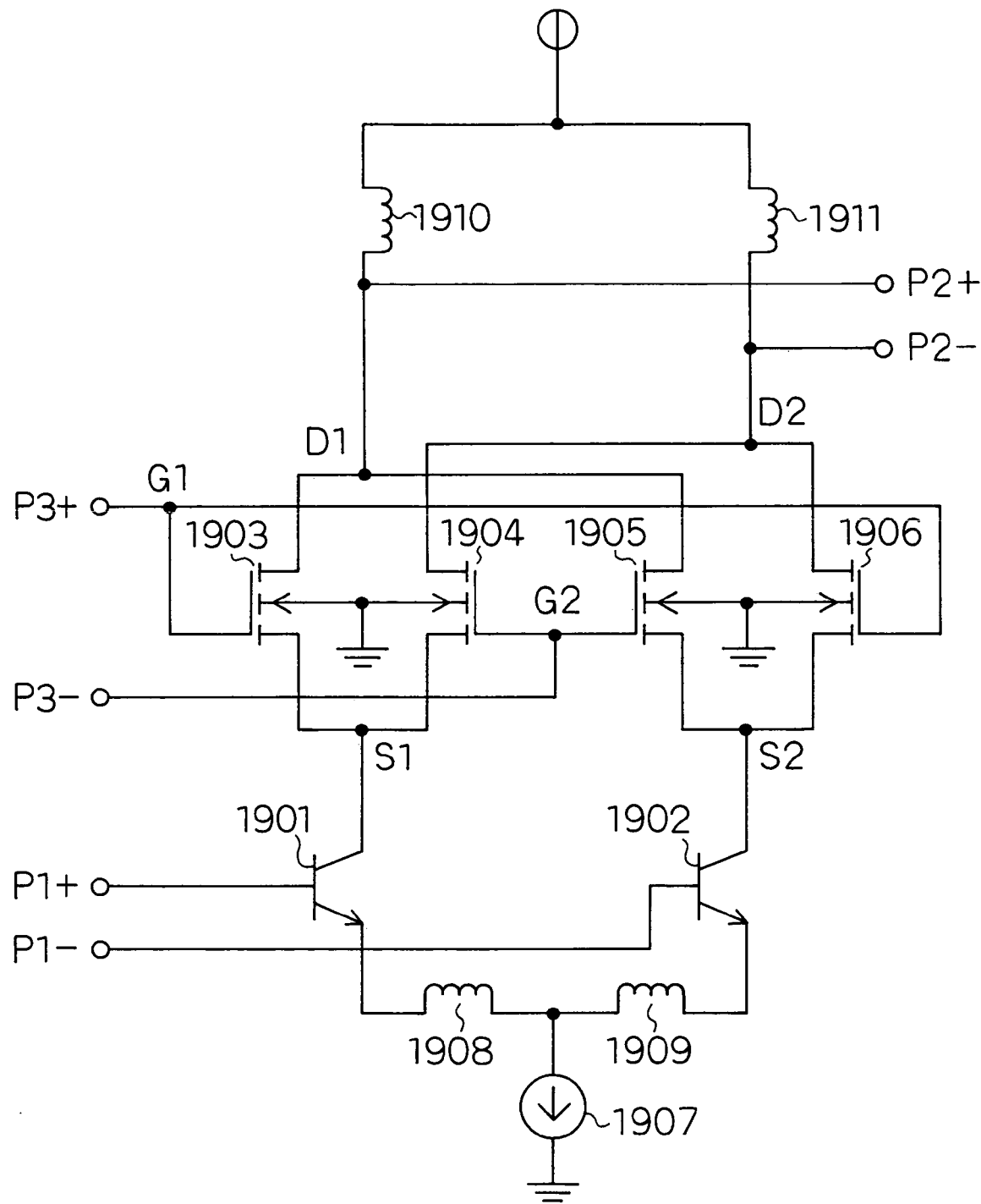
FIG. 19 is a circuit diagram showing the configuration of a mixer apparatus using the semiconductor differential circuit according to a fifth embodiment of the present invention.

The semiconductor differential circuit according to a fifth embodiment of the present invention will be described. FIG. 19 shows a circuit configuration of a double balance mixer. In FIG. 19, reference numerals 1901 and 1902 denote the bipolar transistors, 1903, 1904, 1905 and 1906 denote the MOSFETs corresponding to the first semiconductor device, second semiconductor device, third semiconductor device and fourth semiconductor device of the present invention respectively, 1907 denotes a constant current source, and 1908, 1909, 1910 and 1911 denote inductors. The differential signals are inputted from input nodes P1+ and P1−, and the inputted differential signals are amplified by the bipolar transistors 1901 and 1902. Output signals thereof (corresponding to the differential signals to be mixed with the differential local oscillation signals of the present invention) are inputted to each node connected to the source electrode S1 (corresponding to the first source electrode of the present invention) and the source electrode S2 (corresponding to the second source electrode of the present invention).

To be more specific, one of the output signals is inputted to the source electrode S1 shared by the MOSFETs 1903 and 1904, and the other of the output signals is inputted to the source electrode S2 shared by the MOSFETs 1905 and 1906.

Local oscillation signals (corresponding to the differential local oscillation signals of the present invention) inputted from the input nodes P3+ and P3− are inputted to each node connected to the gate electrode G1 (corresponding to the first gate electrode of the present invention) and gate electrode G2 (corresponding to the second gate electrode of the present invention), and are mixed in the MOSFETs 1903 to 1906. To be more specific, one of the local oscillation signals which are the differential signals is inputted to the gate electrode G1 shared by the MOSFETs 1903 and 1905, and the other of the local oscillation signals is inputted to the gate electrode G2 shared by the MOSFETs 1904 and 1906.

And one of the differential signals inputted from the source electrode S1 is controlled by one of the differential local oscillation signals inputted to the gate electrode G1 of the MOSFET 1903 so that a mixing signal of both (corresponding to a mixed differential signal of the present invention) is outputted as one of the differential signals from the drain electrode D1. And the other of the differential signals inputted from the source electrode S2 is controlled by the other of the differential local oscillation signals inputted to the gate electrode G2 of the MOSFET 1905 so that the mixing signal of both (corresponding to the mixed differential signal of the present invention) is outputted as one of the differential signals from the drain electrode D1.

Likewise, one of the differential signals inputted from the source electrode S1 is controlled by one of the differential local oscillation signals inputted to the gate electrode G2 of the MOSFET 1904 so that the mixing signal of both (corresponding to the mixed differential signal of the present invention) is outputted as the other of the differential signals from the drain electrode D2. And the other of the differential signals inputted from the source electrode S2 is controlled by one of the differential local oscillation signals inputted to the gate electrode G1 so that the mixing signal of both (corresponding to the mixed differential signal of the present invention) is outputted as the other of the differential signals from the drain electrode D2.

Thus, the signals frequency-converted by mixing are outputted to P2+ and P2− nodes from the MOSFETs 1903 to 1906.

Figure 20A:
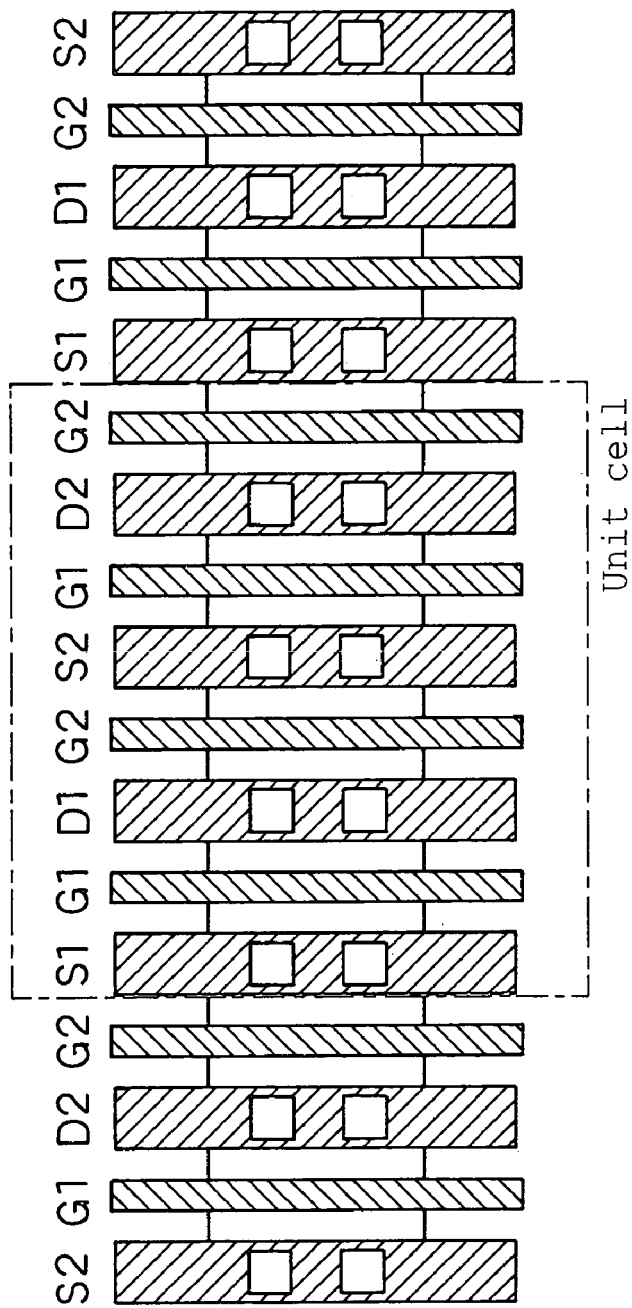
FIG. 20(a) is a plan view showing the configuration of the semiconductor differential circuit according to the fifth embodiment of the present invention.
Figure 20B:
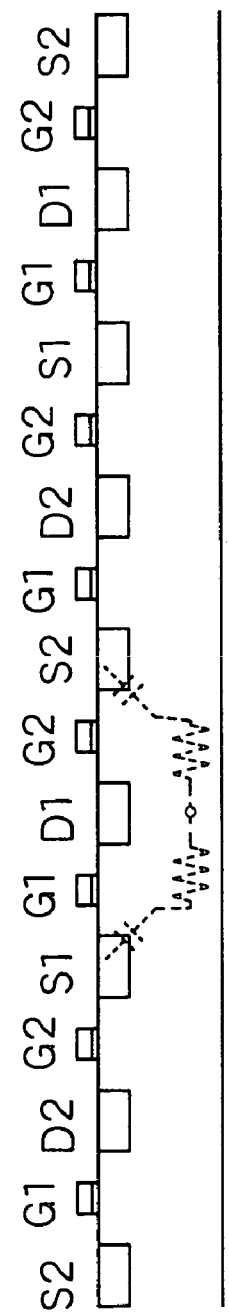
FIG. 20(b) is a sectional view showing the configuration of the semiconductor differential circuit according to the fifth embodiment of the present invention.

Next, the configuration of the MOSFETs 1903 to 1906 will be described. FIG. 20(a) is a plan view of the MOSFETs 1903 to 1906, and FIG. 20(b) is a sectional view thereof. In these drawings, S1, S2, G1, G2, D1 and D2 are equivalent to the electrodes of the same reference numerals in FIG. 19. A unit cell (corresponding to the third unit circuit of the present invention) is in the broken line in FIG. 20(a), which is repeated.

To be more specific, the gate electrode G1 is placed to be adjacent to the source electrode S1 along the longitudinal direction of the source electrode S1, the drain electrode D1 is placed to be adjacent to the gate electrode G1 on the opposite side to the source electrode S1 along the longitudinal direction of the gate electrode G1, the gate electrode G2 is placed to be adjacent to the drain electrode D1 on the opposite side to the gate electrode G1 along the longitudinal direction of the drain electrode D1, the source electrode S2 is placed to be adjacent to the gate electrode G2 on the opposite side to the drain electrode D1 along the longitudinal direction of the gate electrode G2. The gate electrode G1 is placed to be adjacent to the source electrode S2 on the opposite side to the gate electrode G2 along the longitudinal direction of the source electrode S2, the drain electrode D2 is placed to be adjacent to the gate electrode G1 on the opposite side to the source electrode S2 along the longitudinal direction of the gate electrode G1. The gate electrode G2 is placed to be adjacent to the drain electrode D2 on the opposite side to the gate electrode G1 along the longitudinal direction of the drain electrode D2, a circuit having the source electrode S1, source electrode S2, gate electrode G1, gate electrode G2, drain electrode D1 and drain electrode D2 is provided as a third unit circuit, n pieces of the third unit circuit are placed to be mutually adjacent, the gate electrode G2 of the i-th (i is between 1 and n−1) third unit circuit is placed to be adjacent to the source electrode S1 of the i+1-th unit circuit, n pieces of the drain electrode D1 are mutually connected, n pieces of the drain electrode D2 are mutually connected, n pieces of the gate electrode G1 are mutually connected, n pieces of the gate electrode G2 are mutually connected, n pieces of the source electrode S1 are mutually connected, and n pieces of the source electrode S2 are mutually connected.

According to such a configuration, the gate electrodes G1 and G2 and the source electrodes S1 and S2 are symmetrically placed close in addition to the drain electrodes D1 and D2 which are a differential pair of outputs.

To be more specific, the drain electrodes D1 and D2 are placed close at the frequency of the mixed differential signal so that it is equivalent to the one in which the drain electrode D1 is grounded via the first predetermined resistance and the drain electrode D2 is grounded via the resistance of the same resistance value as the first predetermined resistance.

Here, the resistance value of the first predetermined resistance is half the resistance value formed between the drain electrode D1 and drain electrode D2 via the semiconductor substrate 1, which is determined by the space between the drain electrode D1 and drain electrode D2 at the frequency of the mixed differential signal.

Consequently, the loss on the silicon substrate from each node to a virtual ground is reduced so as to improve a noise characteristic and a distortion characteristic of the double balance mixer as in the case of the amplifier circuit.

Furthermore, the loss on the silicon substrate is further reduced and the noise characteristic and distortion characteristic of the double balance mixer are improved in the case where the gate electrodes G1 and G2 are placed close at the frequency of the predetermined differential local oscillation signals so that it is equivalent to the one in which the gate electrode G1 is grounded via the third predetermined resistance and the gate electrode G2 is grounded via the resistance of the same resistance value as the third predetermined resistance.

Here, the resistance value of the third predetermined resistance is half the resistance value formed between the gate electrode G1 and gate electrode G2 via the semiconductor substrate 1, which is determined by the space between the gate electrode G1 and gate electrode G2 at the frequency of the differential local oscillation signals.

Furthermore, the loss on the silicon substrate is further reduced and the noise characteristic and distortion characteristic of the double balance mixer are improved in the case where the source electrode S1 and source electrode S2 are placed close at the frequency of the differential signals to be mixed with the differential local oscillation signals so that it is equivalent to the one in which the source electrode S1 is grounded via the fourth predetermined resistance and the source electrode S2 is grounded via the resistance of the same resistance value as the fourth predetermined resistance.

Here, the resistance value of the fourth predetermined resistance is half the resistance value formed between the source electrode S1 and source electrode S2 via the semiconductor substrate 1, which is determined by the space between the source electrode S1 and source electrode S2 at the frequency of the above described differential signals to be mixed.

According to this embodiment, the first semiconductor device, second semiconductor device, third semiconductor device and fourth semiconductor device are the multi-finger type FETs in a typical case respectively. The longitudinal direction of the drain electrode D2 is placed along and in the proximity of the longitudinal direction of the drain electrode D1. In the case where the gate electrode G1 and gate electrode G2 are placed close, the longitudinal direction of the gate electrode G2 is placed along and in the proximity of the longitudinal direction of the gate electrode G1. Furthermore, in the case where the source electrode S1 and source electrode S2 are placed close, the longitudinal direction of the source electrode S2 is placed along and in the proximity of the longitudinal direction of the source electrode S1.

However, the first semiconductor device, second semiconductor device, third semiconductor device and fourth semiconductor device do not have to be the multi-finger type FETs respectively. For instance, the configurations may be as shown in FIGS. 3 to 5. Even in that case, the same effect as above can be obtained if any of the pairs of the drain electrode D1 and drain electrode D2, gate electrode G1 and gate electrode G2 and source electrode S1 and source electrode S2 is mutually close.

This embodiment was described by illustrating the double balance mixer. However, the present invention is not limited to the double balance mixer, but includes a circuit apparatus for sharing the source of each FET by using the semiconductor differential circuit of the present invention.

Furthermore, it is also thinkable to use the bipolar transistors instead of the MOSFETs.

The circuits illustrated in the above description indicate the operation on the assumption that each semiconductor is a p type. However, needless to say, it is not limited thereto, but the same effect as above can be obtained with an n type.

The semiconductor differential circuit according to the present invention is capable of miniaturizing the IC chip, and is useful in the oscillation apparatus, amplifying apparatus, switching apparatus, mixer apparatus and so on.

What is claimed is:

1. A semiconductor differential circuit comprising:
   a semiconductor substrate,
      a first semiconductor device formed on said semiconductor substrate, having a first gate electrode for having one of differential signals conveyed thereto and a first drain electrode for outputting one of the differential signals controlled by said first gate electrode;
      a second semiconductor device formed on said semiconductor substrate, having a second gate electrode for having the other of said differential signals conveyed thereto and a second drain electrode for outputting the other of the differential signals controlled by said second gate electrode, and wherein:
      said first drain electrode and said second drain electrode are placed in proximity so that, at a predetermined frequency, it is equivalent to the one in which said first drain electrode is grounded via a first predetermined resistance, and said second drain electrode is grounded via a resistance of the same resistance value as said first predetermined resistance.

2. The semiconductor differential circuit according to claim 1, wherein the resistance value of said first predetermined resistance is half the resistance value formed between said first drain electrode and said second drain electrode via said semiconductor substrate, which is determined by space between said first drain electrode and said second drain electrode at said predetermined frequency.

3. The semiconductor differential circuit according to claim 1 or 2, wherein:
   said first gate electrode is placed to be adjacent to said first drain electrode;
   said second gate electrode is placed to be adjacent to said second drain electrode; and
   a source electrode is placed to surround said first drain electrode, said second drain electrode, said first gate electrode and said second gate electrode and to be adjacent to said first gate electrode and said second gate electrode.

4. The semiconductor differential circuit according to claim 3, wherein there are two pieces each of said first drain electrode and said second drain electrode, and one first drain electrode and one second drain electrode are placed to be in proximity, the other first drain electrode and the other second drain electrode are placed to be in proximity, said one first drain electrode and said other second drain electrode are placed to be in proximity, and said other first drain electrode and said one second drain electrode are placed to be in proximity.

5. The semiconductor differential circuit according to claim 1, wherein said first semiconductor device and said second semiconductor device are multi-finger type FETs respectively, and are placed so that a longitudinal direction of said second drain electrode is along and in the proximity of the longitudinal direction of said first drain electrode.

6. The semiconductor differential circuit according to claim 5, wherein:
as to said first semiconductor device:
said first gate electrode is placed to be adjacent to said first drain electrode along the longitudinal direction of said first drain electrode; and
it has a first source electrode placed to be adjacent to said first gate electrode along the longitudinal direction of said first gate electrode, and
as to said second semiconductor device:
said second gate electrode is placed to be adjacent to said second drain electrode along the longitudinal direction of said second drain electrode; and
it has a second source electrode placed to be adjacent to said second gate electrode along the longitudinal direction of said second gate electrode, and
a circuit comprising said first semiconductor device and said second semiconductor device is provided as a first unit circuit;
n pieces of said first unit circuit are placed to be mutually adjacent;
an i+1-th first unit circuit is placed to be adjacent to an i-th (i is between 1 and n−1) first unit circuit; and
said n pieces of first drain electrode are mutually connected, said n pieces of second drain electrode are mutually connected, said n pieces of first gate electrode are mutually connected, said n pieces of second gate electrode are mutually connected, and said n pieces of first source electrode and said n pieces of second source electrode are mutually connected.

7. The semiconductor differential circuit according to claim 5, wherein:
a third source electrode is formed on said semiconductor substrate;
said first gate electrode is placed to be adjacent to said third source electrode along the longitudinal direction of said third source electrode;
said first drain electrode is placed in the proximity of said first gate electrode on the opposite side to said third source electrode along the longitudinal direction of said first gate electrode;
said second drain electrode is placed to be adjacent to said first drain electrode on the opposite side to said first gate electrode along the longitudinal direction of said first drain electrode;
said second gate electrode is placed to be adjacent to said second drain electrode on the opposite side to said first drain electrode along the longitudinal direction of said second drain electrode, and
a circuit comprising said third source electrode, said first gate electrode, said first drain electrode, said second drain electrode and said second gate electrode is provided as a second unit circuit;
n pieces of said second unit circuit are placed to be mutually adjacent;
said second gate electrode of the i-th (i is between 1 and n−1) second unit circuit is placed to be adjacent to said third source electrode of the i+1-th second unit circuit; and
said n pieces of first drain electrode are mutually connected, said n pieces of second drain electrode are mutually connected, said n pieces of first gate electrode are mutually connected, said n pieces of second gate electrode are mutually connected, and said n pieces of third source electrode are mutually connected.

8. The semiconductor differential circuit according to claim 1, wherein:
said first gate electrode is placed to surround said first drain electrode;
said second gate electrode is placed to surround said second drain electrode; and
a source electrode is placed between said first gate electrode and said second gate electrode.

9. The semiconductor differential circuit according to claim 8, wherein:
there are two pieces each of said first drain electrode and said second drain electrode;
a source electrode is placed between one first drain electrode and one second drain electrode;
an electrode connected to said source electrode is placed between the other first drain electrode and the other second drain electrode;
an electrode connected to said source electrode is placed between one first drain electrode and the other second drain electrode; and
an electrode connected to said source electrode is placed between the other first drain electrode and said one second drain electrode.

10. The semiconductor differential circuit according to claim 1, wherein:
it further comprises:
a third semiconductor device, formed on said semiconductor substrate, having a second gate electrode for having the other of said differential signals conveyed thereto, and a first drain electrode for outputting one of the differential signals controlled by said second gate electrode; and
a fourth semiconductor device, formed on said semiconductor substrate, having a first gate electrode for having one of said differential signals conveyed thereto, and a second drain electrode for outputting the other of the differential signals controlled by said first gate electrode, and
the differential signals conveyed to said first gate electrode and said second gate electrode are differential local oscillation signals;
said first semiconductor device has a first source electrode for having one of the differential signals to be mixed with said differential local oscillation signals conveyed thereto;
said second semiconductor device shares said first source electrode with said first semiconductor device;
said third semiconductor device shares said first drain electrode with said first semiconductor device, and has a second source electrode for having the other of the differential signals to be mixed with said differential local oscillation signals conveyed thereto;
said fourth semiconductor device shares said second source electrode with said third semiconductor device, and shares said second drain electrode with said second semiconductor device;
said differential signals controlled by said second gate electrode are the differential signals having said differential local oscillation signals and said differential signals to be mixed therein; and
said first drain electrode and said second drain electrode are placed in the proximity so that, at a frequency of said mixed differential signals, it is equivalent to the one in which said first drain electrode is grounded via a first predetermined resistance, and said second drain electrode is grounded via a resistance of the same resistance value as said first predetermined resistance.

11. The semiconductor differential circuit according to claim 10, wherein:
said first gate electrode and said second gate electrode are placed in the proximity so that, at a frequency of said differential local oscillation signals, it is equivalent to the one in which said first gate electrode is grounded via a third predetermined resistance, and said second gate electrode is grounded via a resistance of the same resistance value as said third predetermined resistance; and
said first source electrode and said second source electrode are placed in the proximity so that, at a frequency of the differential signals to be mixed with said differential local oscillation signals, it is equivalent to the one in which said first source electrode is grounded via a fourth predetermined resistance, and said second source electrode is grounded via a resistance of the same resistance value as said fourth predetermined resistance.

12. The semiconductor differential circuit according to claim 11, wherein the resistance value of said third predetermined resistance is half the resistance value formed between said first gate electrode and said second gate electrode via said semiconductor substrate, which is determined by space between said first gate electrode and said second gate electrode at the frequency of said differential local oscillation signals.

13. The semiconductor differential circuit according to claim 11, wherein the resistance value of said fourth predetermined resistance is half the resistance value formed between said first source electrode and said second source electrode via said semiconductor substrate, which is determined by space between said first source electrode and said second source electrode at the frequency of the differential signals to be mixed.

14. The semiconductor differential circuit according to claim 11, wherein said first semiconductor device, said second semiconductor device, said third semiconductor device and said fourth semiconductor device are multi-finger type FETs respectively, and are placed so that a longitudinal direction of said second gate electrode is along and in the proximity of the longitudinal direction of said first gate electrode.

15. The semiconductor differential circuit according to claim 11, wherein said first semiconductor device, said second semiconductor device, said third semiconductor device and said fourth semiconductor device are multi-finger type FETs respectively, and are placed so that a longitudinal direction of said second source electrode is along and in the proximity of the longitudinal direction of said first source electrode.

16. The semiconductor differential circuit according to claim 10, wherein the resistance value of said first predetermined resistance is half the resistance value formed between said first drain electrode and said second drain electrode via said semiconductor substrate, which is determined by space between said first drain electrode and said second drain electrode at the frequency of said mixed differential signals.

17. The semiconductor differential circuit according to claim 10, wherein said first semiconductor device, said second semiconductor device, said third semiconductor device and said fourth semiconductor device are multi-finger type FETs respectively, and are placed so that a longitudinal direction of said second drain electrode is along and in the proximity of the longitudinal direction of said first drain electrode.

18. The semiconductor differential circuit according to any one of claim 17, 14 or 15, wherein:
the first source electrode is formed on said semiconductor substrate;
said first gate electrode is placed to be adjacent to said first source electrode along the longitudinal direction of said first source electrode; and
said first drain electrode is placed to be adjacent to said first gate electrode on the opposite side to said first source electrode along the longitudinal direction of said first gate electrode;
said second gate electrode is placed to be adjacent to said first drain electrode on the opposite side to said first gate electrode along the longitudinal direction of said first drain electrode;
said second source electrode is placed to be adjacent to said second gate electrode on the opposite side to said first drain electrode along the longitudinal direction of said second gate electrode;
said first gate electrode is placed to be adjacent to said second source electrode on the opposite side to said second gate electrode along the longitudinal direction of said second source electrode;
said second drain electrode is placed to be adjacent to said first gate electrode on the opposite side to said second source electrode along the longitudinal direction of said first gate electrode;
said second gate electrode is placed to be adjacent to said second drain electrode on the opposite side to said first gate electrode along the longitudinal direction of said second drain electrode, and
a circuit having said first source electrode, said second source electrode, said first gate electrode, said second gate electrode, said first drain electrode and said second drain electrode is provided as a third unit circuit;
n pieces of said third unit circuit are placed to be mutually adjacent;
said second gate electrode of an i-th (i is between 1 and n−1) third unit circuit is placed to be adjacent to said first source electrode of an i+1-th third unit circuit; and
said n pieces of first drain electrode are mutually connected, said n pieces of second drain electrode are mutually connected, said n pieces of first gate electrode are mutually connected, said n pieces of second gate electrode are mutually connected, said n pieces of first source electrode are mutually connected, and said n pieces of second source electrode are mutually connected.

19. A circuit apparatus sharing an FET source, using the semiconductor differential circuit according to claim 1.

20. A semiconductor differential circuit comprising:
a semiconductor substrate,
a first semiconductor device, formed on said semiconductor substrate, having a first collector or base for having one of differential signals conveyed thereto; and
a second semiconductor device, formed on said semiconductor substrate, having a second collector or base for having the other of said differential signals conveyed thereto, and wherein:
said first collector or base and said second collector or base are placed in the proximity so that, at a predetermined frequency, it is equivalent to the one in which said first collector or base is grounded via a second predetermined resistance, and said second collector or base is grounded via a resistance of the same resistance value as said second predetermined resistance.

21. An oscillation apparatus using the semiconductor differential circuit according to claim 1 or 20.

22. A switching apparatus using the semiconductor differential circuit according to claim 1 or 20.

23. An amplifying apparatus using the semiconductor differential circuit according to claim 1 or 20.

24. A mixer apparatus using the semiconductor differential circuit according to any one of claims 1, 20 and 10.

25. A semiconductor differential circuit placement method comprising the steps of:
   forming on a semiconductor substrate a first semiconductor device having a first drain electrode for having one of differential signals conveyed thereto and a first gate electrode for controlling said one of the signals;
   forming on said semiconductor substrate a second semiconductor device having a second drain electrode for having the other of said differential signals conveyed thereto and a second gate electrode for having said other signal conveyed thereto formed, and wherein:
   said first drain electrode and said second drain electrode are placed in the proximity so that, at a predetermined frequency, it is equivalent to the one in which said first drain electrode is grounded via a first predetermined resistance, and said second drain electrode is grounded via a resistance of the same resistance value as said first predetermined resistance.

* * * * *